US008580333B2

(12) United States Patent
Kimura et al.

(10) Patent No.: US 8,580,333 B2
(45) Date of Patent: Nov. 12, 2013

(54) MATRIX TYPE DISPLAY DEVICE WITH OPTICAL MATERIAL AT PREDETERMINED POSITIONS AND MANUFACTURING METHOD THEREOF

(75) Inventors: Mutsumi Kimura, Suwa (JP); Hiroshi Kiguchi, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 403 days.

(21) Appl. No.: 12/614,978

(22) Filed: Nov. 9, 2009

(65) Prior Publication Data

US 2010/0173450 A1  Jul. 8, 2010

Related U.S. Application Data

(63) Continuation of application No. 09/077,029, filed as application No. PCT/JP97/03297 on Sep. 18, 1997, now abandoned.

(30) Foreign Application Priority Data

Sep. 19, 1996 (JP) .................................. 8-248087

(51) Int. Cl.
*B05D 5/06* (2006.01)
*B05D 1/36* (2006.01)
*B05D 1/32* (2006.01)
*B05D 3/02* (2006.01)
*B05D 1/02* (2006.01)

(52) U.S. Cl.
USPC ............. 427/66; 427/265; 427/282; 427/384; 427/421.1; 313/504; 313/506; 438/29

(58) Field of Classification Search
USPC .............................. 427/66, 282, 372.2, 421.1, 427/427.4–427.6, 265, 384; 313/504, 506; 438/29
See application file for complete search history.

(56) References Cited

U.S. PATENT DOCUMENTS 3,792,308 A   2/1974 Ota
3,863,332 A   2/1975 Leupp et al.
(Continued)

FOREIGN PATENT DOCUMENTS

DE   42 12 501 C1   8/1993
DE   196 03 451 A1   1/1995
(Continued)

OTHER PUBLICATIONS

Ebisawa, F. et al., "Electrical Properties of polyacetylene/polysiloxane interface", *J. Appl. Phys.*, vol. 54, No. 6, Jun. 1983, pp. 3255-3259.
Kido, Junji et al., "Organic electroluminescent devices based on molecularly doped polymers", *Appl. Phys. Lett.*, vol. 61, No. 7, Aug. 17, 1992, pp. 761-763.
Van Slyke, S.A. et al., "Organic electroluminescent devices with improved stability", *Appl. Phys. Lett.*, vol. 69, No. 15, Oct. 7, 1996, pp. 2160-2162.

(Continued)

*Primary Examiner* — James Lin
(74) *Attorney, Agent, or Firm* — Oliff & Berridge, PLC

(57) ABSTRACT

An object of the invention is to improve patterning accuracy while maintaining low cost, high throughput and a high degree of freedom of an optical material in a matrix type display device and a manufacturing method thereof.
In order to achieve the object, a difference in height, a desired distribution of liquid repellency and affinity to liquid, or a desired potential distribution is formed by utilizing first bus lines in a passive matrix type display device or utilizing scanning lines, signal lines, common current supply lines, pixel electrodes, an interlevel insulation film, or a light shielding layer in an active matrix type display device. A liquid optical material is selectively coated at predetermined positions by utilizing the difference in height, the desired distribution of liquid repellency and affinity to liquid, or the desired potential distribution.

2 Claims, 13 Drawing Sheets

(56) References Cited

U.S. PATENT DOCUMENTS

| | | | |
|---|---|---|---|
| 3,956,032 A | 5/1976 | Powell et al. | |
| 4,007,462 A | 2/1977 | Wetsel, Jr. | |
| 4,135,959 A | 1/1979 | Luo et al. | |
| 4,499,149 A * | 2/1985 | Berger | 428/447 |
| 4,569,305 A | 2/1986 | Ferri et al. | |
| 4,683,146 A | 7/1987 | Hirai et al. | |
| 4,687,352 A | 8/1987 | Igi et al. | |
| 4,781,438 A | 11/1988 | Noguchi | |
| 4,792,817 A | 12/1988 | Barney | |
| 4,891,110 A | 1/1990 | Libman et al. | |
| 5,041,190 A | 8/1991 | Drake et al. | |
| 5,132,248 A | 7/1992 | Drummond et al. | |
| 5,202,261 A | 4/1993 | Musho et al. | |
| 5,206,749 A | 4/1993 | Zavracky et al. | |
| 5,214,350 A | 5/1993 | Remec et al. | |
| 5,231,329 A * | 7/1993 | Nishikitani et al. | 313/503 |
| 5,247,190 A | 9/1993 | Friend et al. | |
| 5,250,439 A | 10/1993 | Musho et al. | |
| 5,274,481 A | 12/1993 | Kim | |
| 5,276,380 A | 1/1994 | Tang | |
| 5,281,450 A | 1/1994 | Yaniv | |
| 5,281,489 A | 1/1994 | Mori et al. | |
| 5,294,870 A | 3/1994 | Tang et al. | |
| 5,317,169 A | 5/1994 | Nakano et al. | |
| 5,326,692 A | 7/1994 | Brinkley et al. | |
| 5,328,809 A | 7/1994 | Holmes et al. | |
| 5,340,619 A * | 8/1994 | Chen et al. | 427/498 |
| 5,363,800 A | 11/1994 | Larkin et al. | |
| 5,399,390 A | 3/1995 | Akins | |
| 5,400,157 A | 3/1995 | Won | |
| 5,409,777 A | 4/1995 | Kennedy et al. | |
| 5,438,241 A | 8/1995 | Zavracky et al. | |
| 5,439,519 A | 8/1995 | Sago et al. | |
| 5,472,889 A | 12/1995 | Kim et al. | |
| 5,477,352 A | 12/1995 | Hirai et al. | |
| 5,510,066 A | 4/1996 | Fink et al. | |
| 5,525,434 A | 6/1996 | Nashimoto | |
| 5,534,716 A | 7/1996 | Takemura | |
| 5,536,603 A | 7/1996 | Tsuchiya et al. | |
| 5,540,999 A | 7/1996 | Yamamoto et al. | |
| 5,552,192 A | 9/1996 | Kashiwazaki et al. | |
| 5,554,339 A | 9/1996 | Cozzette et al. | |
| 5,558,946 A | 9/1996 | Nishimoto | |
| 5,576,070 A | 11/1996 | Yaniv | |
| 5,589,732 A | 12/1996 | Okibayashi et al. | |
| 5,593,788 A | 1/1997 | Shi et al. | |
| 5,610,932 A | 3/1997 | Kessler et al. | |
| 5,616,427 A | 4/1997 | Tada | |
| 5,645,901 A | 7/1997 | Fukuchi et al. | |
| 5,652,019 A | 7/1997 | Moran | |
| 5,652,067 A | 7/1997 | Ito et al. | |
| 5,656,826 A | 8/1997 | Misawa et al. | |
| 5,665,857 A | 9/1997 | Shi | |
| 5,705,302 A | 1/1998 | Ohno et al. | |
| 5,713,278 A | 2/1998 | Kawano et al. | |
| 5,728,626 A | 3/1998 | Allman et al. | |
| 5,734,455 A | 3/1998 | Yoshida et al. | |
| 5,742,129 A | 4/1998 | Nagayama et al. | |
| 5,744,171 A | 4/1998 | Schneider | |
| 5,757,453 A | 5/1998 | Shin et al. | |
| 5,759,268 A | 6/1998 | Begin et al. | |
| 5,763,139 A | 6/1998 | Matsunaga et al. | |
| 5,770,260 A | 6/1998 | Fukuyama et al. | |
| 5,771,562 A | 6/1998 | Harvey, III et al. | |
| 5,779,799 A | 7/1998 | Davis | |
| 5,784,132 A | 7/1998 | Hashimoto | |
| 5,804,917 A | 9/1998 | Takahashi et al. | |
| 5,807,627 A | 9/1998 | Friend et al. | |
| 5,821,002 A | 10/1998 | Ohnishi et al. | |
| 5,821,138 A | 10/1998 | Yamazaki et al. | |
| 5,824,374 A | 10/1998 | Bradley et al. | |
| 5,831,701 A | 11/1998 | Matsuyama et al. | |
| 5,854,139 A | 12/1998 | Aratani et al. | |
| 5,874,200 A | 2/1999 | Ra et al. | |
| 5,895,692 A | 4/1999 | Shirasaki et al. | |
| 5,909,081 A | 6/1999 | Eida et al. | |
| 5,929,464 A | 7/1999 | Yamazaki et al. | |
| 5,935,331 A | 8/1999 | Naka et al. | |
| 5,972,419 A | 10/1999 | Roitman | |
| 5,989,945 A | 11/1999 | Yudasaka et al. | |
| 5,997,122 A | 12/1999 | Moriyama et al. | |
| 6,008,828 A | 12/1999 | Furuki et al. | |
| 6,013,982 A | 1/2000 | Thompson et al. | |
| RE36,711 E | 5/2000 | Yaniv | |
| 6,087,196 A | 7/2000 | Sturm et al. | |
| 6,104,311 A | 8/2000 | Lastinger | |
| 6,137,221 A | 10/2000 | Roitman et al. | |
| 6,153,711 A | 11/2000 | Towns et al. | |
| 6,180,294 B1 | 1/2001 | Shiba et al. | |
| 6,187,457 B1 | 2/2001 | Arai et al. | |
| 6,195,142 B1 | 2/2001 | Gyotoku et al. | |
| 6,337,222 B1 | 1/2002 | Shimoda et al. | |
| 6,580,212 B2 | 6/2003 | Friend | |
| 6,610,552 B2 | 8/2003 | Fujimori et al. | |
| 6,696,785 B2 | 2/2004 | Shimoda et al. | |
| 6,755,983 B2 | 6/2004 | Yudasaka | |
| 2002/0011783 A1 | 1/2002 | Hosokawa | |
| 2002/0163300 A1 | 11/2002 | Duineveld et al. | |

FOREIGN PATENT DOCUMENTS

| | | |
|---|---|---|
| EP | 0 218 117 A2 | 4/1987 |
| EP | 04 545 A2 | 12/1990 |
| EP | 0 431 249 | 6/1991 |
| EP | 0 486 318 A1 | 11/1991 |
| EP | 0 550 063 A2 | 7/1993 |
| EP | 0 589 049 A1 | 3/1994 |
| EP | 0 656 644 A1 | 6/1995 |
| EP | 0 665 449 A1 | 8/1995 |
| EP | 0 717 439 A2 | 6/1996 |
| EP | 196 03 451 | 8/1996 |
| EP | 0 732 868 A1 | 9/1996 |
| EP | 0 756 932 A2 | 2/1997 |
| EP | 0 862 156 A1 | 9/1998 |
| JP | A 59-075205 | 4/1984 |
| JP | A 60-107083 | 6/1985 |
| JP | A 61-78165 | 4/1986 |
| JP | A 62-031174 | 2/1987 |
| JP | A 62-085224 | 4/1987 |
| JP | A 62-223727 | 10/1987 |
| JP | A 62-295028 | 12/1987 |
| JP | A 63-155527 | 6/1988 |
| JP | A 63-235901 | 9/1988 |
| JP | A 01-140188 | 6/1989 |
| JP | A 03-033824 | 2/1991 |
| JP | A 03-102324 | 4/1991 |
| JP | A 03-126921 | 5/1991 |
| JP | A 03-168613 | 7/1991 |
| JP | A 03-192334 | 8/1991 |
| JP | A 03-229886 | 10/1991 |
| JP | A 03-244630 | 10/1991 |
| JP | A 03-250583 | 11/1991 |
| JP | A 03-269995 | 12/1991 |
| JP | A 04-500582 | 1/1992 |
| JP | A 04-123007 | 4/1992 |
| JP | A 04-125683 | 4/1992 |
| JP | A 04-253033 | 9/1992 |
| JP | A 04-337284 | 11/1992 |
| JP | A-5-30113 | 2/1993 |
| JP | A 05-105486 | 4/1993 |
| JP | A 05-116941 | 5/1993 |
| JP | A 05-224012 | 9/1993 |
| JP | A 05-225104 | 9/1993 |
| JP | A 05-258860 | 10/1993 |
| JP | A 05-283166 | 10/1993 |
| JP | B2 05-078655 | 10/1993 |
| JP | A 05-297404 | 11/1993 |
| JP | A 05-297407 | 11/1993 |
| JP | A 06-500813 | 1/1994 |
| JP | A 06-33048 | 2/1994 |
| JP | A 06-504139 | 5/1994 |
| JP | A 06-186416 | 7/1994 |
| JP | A 06-189899 | 7/1994 |
| JP | A 06-204168 | 7/1994 |

(56) References Cited

FOREIGN PATENT DOCUMENTS

| | | |
|---|---|---|
| JP | A 06-281958 | 10/1994 |
| JP | A 06-308312 | 11/1994 |
| JP | A 63-008312 | 11/1994 |
| JP | A 06-281917 | 2/1995 |
| JP | A 07-101068 | 4/1995 |
| JP | A 07-122475 | 5/1995 |
| JP | A 07-134288 | 5/1995 |
| JP | A 07-235378 | 5/1995 |
| JP | A 07-153574 | 6/1995 |
| JP | A 07-169567 | 7/1995 |
| JP | A 07-192867 | 7/1995 |
| JP | A 07-220761 | 8/1995 |
| JP | A 07-134288 | 9/1995 |
| JP | A 07-235378 | 9/1995 |
| JP | A 07-294916 | 11/1995 |
| JP | A 07-318723 | 12/1995 |
| JP | A 07-509339 | 12/1995 |
| JP | A 08-001065 | 1/1996 |
| JP | A 08-032085 | 2/1996 |
| JP | A 08-060372 | 3/1996 |
| JP | A 08-162019 | 6/1996 |
| JP | A 08-179113 | 7/1996 |
| JP | A 08-179307 | 7/1996 |
| JP | A 08-188658 | 7/1996 |
| JP | A 08-188663 | 7/1996 |
| JP | A-8-203439 | 8/1996 |
| JP | A-8-204207 | 8/1996 |
| JP | A 09-153330 | 6/1997 |
| JP | A 09-178929 | 7/1997 |
| JP | A-9-230129 | 9/1997 |
| JP | A 09-231908 | 9/1997 |
| JP | A 10-012377 | 1/1998 |
| KR | 00135288 | 1/1998 |
| KR | 1995-0702785 | 10/2001 |
| WO | WO 90/13148 | 11/1990 |
| WO | WO/94 03031 | 2/1994 |
| WO | WO 95/01871 | 1/1995 |
| WO | WO 98/32783 | 7/1998 |
| WO | WO 02/18513 A1 | 3/2002 |

OTHER PUBLICATIONS

Zhang, C. et al., "Blue electroluminscent diodes utilizing blends of poly(p-phenylphenylene vinylene) in poly(9-vinylcarbazole)", Synthetic Metals, vol. 62, 1994, pp. 35-40.

Vestweber, H. et al., "Electroluminescence from polymer blends and molecularly doped polymers", Synthetic Metals, vol. 64, 1994, pp. 141-145.

Nonaka, Y. et al., "Development of Color Filters by Pigment Ink Jet Printing (I) (Fundamental Technology)", SID, 1997, pp. 238-241.

Wu, Chung-Chih et al., "Efficient Organic Electroluminescent Devices Using Single-Layer Doped Polymer Thin Films with Bipolar Carrier Transport Abilities", IEEE Transactions on Electron Devices, vol. 44, No. 8, Aug. 1997, pp. 1269-1281.

Wu, C.C. et al., "Surface modification of indium tin oxide by plasma treatment: An effective method to improve the efficiency, brightness, and reliability of organic light emitting devices", Appl. Phys. Lett., vol. 70, No. 11, Mar. 17, 1997, pp. 1348-1350.

Tian, Jing et al., "Luminescent Properties of Conjugated Poly(p-pyridylvinylene) and Poly(p-pyridiniumvinylene)", Polymer Preprints, vol. 35, No. 2, Aug. 1994, pp. 761-762.

Marsells, Michael J. et al. "Regiochemical Consequences in Poly(2,5-Pyridinium Vinylene): Kekule' and Non-Kekule' Conductive Polymers", Polymer Preprints, vol. 33, No. 1, Apr. 1992, pp. 1196-1197.

Hosokawa, Chishio et al., "Highly efficient blue electroluminescence from a distyrylarylene emitting layer with a new dopant", Appl. Phys. Lett., vol. 67, No. 26, Dec. 25, 1995, pp. 3853-3855.

Hebner, T.R. et al. "Ink-jet printing of doped polymers for organic light emitting devices", Appl. Phys. Lett., vol. 72, No. 5, Feb. 2, 1998, pp. 519-521.

Mayo, Jonathan W. et al., "16.3: Colour Filters for Flat Panel Displays by High Definition Ink Jet Printing", Euro Display '96, Oct. 1-3, 1996, pp. 537-540.

Parker, I.D. et al., "Efficient blue electroluminescence from a fluorinated polyquinoline", Appl. Phys. Lett., vol. 65, No. 10, Sep. 5, 1994, pp. 1272-1274.

Tian, Jing et al., "Photophysical Properties, Self-Assembled Thin Films, and Light-Emitting Diodes of Poly(p-pyridylvinylene)s and Poly(p-pyridinium vinylene)s", Chem. Mater., vol. 7, No. 11, 1995, pp. 2190-2198.

Tian, Jing et al., "Electroluminescent Properties of Self-Assembled Polymer Thin Films", Adv. Mater., vol. 7, No. 4, 1995, pp. 395-398.

Johnson, G.E. et al., "Electroluminescence from single layer molecularly doped polymer films", Pure & Appl. Chem., vol. 67, No. 1, 1995, pp. 175-182.

Lewis, Richard J., Hawley's Condensed Chemical Dictionary, Thirteenth Edition, 1997, pp. 820 & 900-901.

Morrison, Robert et al., Organic Chemistry, Fifth Edition, 1987, p. 637.

Budavari, Susan et al., The Merck Index An Encyclopedia of Chemicals, Drugs, and Biologicals, Twelfth Edition, 1996, p. 357.

Adachi, Chihaya et al., "Blue light-emitting organic electroluminescent devices", Appl. Phys. Lett., vol. 56, No. 9, Feb. 26, 1990, pp. 799-801.

Burrows, P.E. et al., "Color-tunable organic light-emitting devices", Appl. Phys. Lett., vol. 69, No. 20, Nov. 11, 1996, pp. 2959-2961.

Kido, J. et al., "Single-layer white light-emitting organic electroluminescent devices based on dye-dispersed poly(N-vinylcarbazole)", Appl. Phys. Lett., vol. 67, No. 16, Oct. 16, 1995, pp. 2281-2283.

Wu, C.C. et al., "Integrated three-color organic light-emitting devices", Appl. Phys. Lett., vol. 69, No. 21, Nov. 18, 1996, pp. 3117-3119.

Zhang, C. et al., "Blue emission from polymer light-emitting diodes using non-conjugated polymer blends with air-stable electrodes", Synthetic Metals, vol. 72, 1995, pp. 185-188.

Ishimaru, N. et al., Development of Color Filters by Pigment Ink Jet Printing (II) (-Production Technology-), SID, 1997, pp. 69-72.

Kido, J. et al., "White Light-Emitting Organic Electroluminescent Devices Using the Poly (N-vinylcarbazole) Emitter Layer Doped with Three Flourescent Dyes", Appl. Phys. Lett., 64 (7), Feb. 14, 1994, pp. 815-817.

Adachi, Chihaya et al., "Electroluminescent Device of Organic Thin Films", IEICE Technical Report, vol. 89, No. 106, Jun. 23, 1989, pp. 49-50.

U.S. Appl. No. 09/901,095, filed Jul. 2001, Kimura et al.

U.S. Appl. No. 09/901,096, filed Jul. 2001, Kiguchi et al.

U.S. Appl. No. 09/901,126, filed Jul. 2001, Yudasaka et al.

Uchida, Masao et al., "Color-Variable Light-Emitting Diode Utilizing Conducting Polymer Containing Fluorescent Dye", Jpn. J. Appl. Phys., Part 2 (1993), 32 (7A), L921-L924 (Chemical Abstract, vol. 119, No. 16).

"Electroluminescence in Conjugated Polymers;" R. H. Friend, R. W. Gymer, A. B. Holmes, J. H. Burroughes, R. N. Marks, C. Taliani, D. D. C. Bradley, D. A. Dos Santos, J. L. Bredas, M. Logdlund & W. R. Salaneck; Nature, vol. 397, Jan. 14, 1999.

Opto-Electronic Properties of Disordered Organic Semiconductors, Proefschrift, Michel Cornelis Josephus Marie Vissnberg, geboren to Sint Maarten in 1972.

Fabrication of Organic Light-Emitting Devices, Jennifer Reinig, Junior Physics/Math Major at Drake University, Physics REU: IA State University, Summer 2001.

The electroluminescence of organic materials; Ullrich Mitschke and Peter Bauerle, Accepted Feb. 15, 2000, Published on the Web Jun. 6, 2000.

Definitions from Dictionary.com.

* cited by examiner

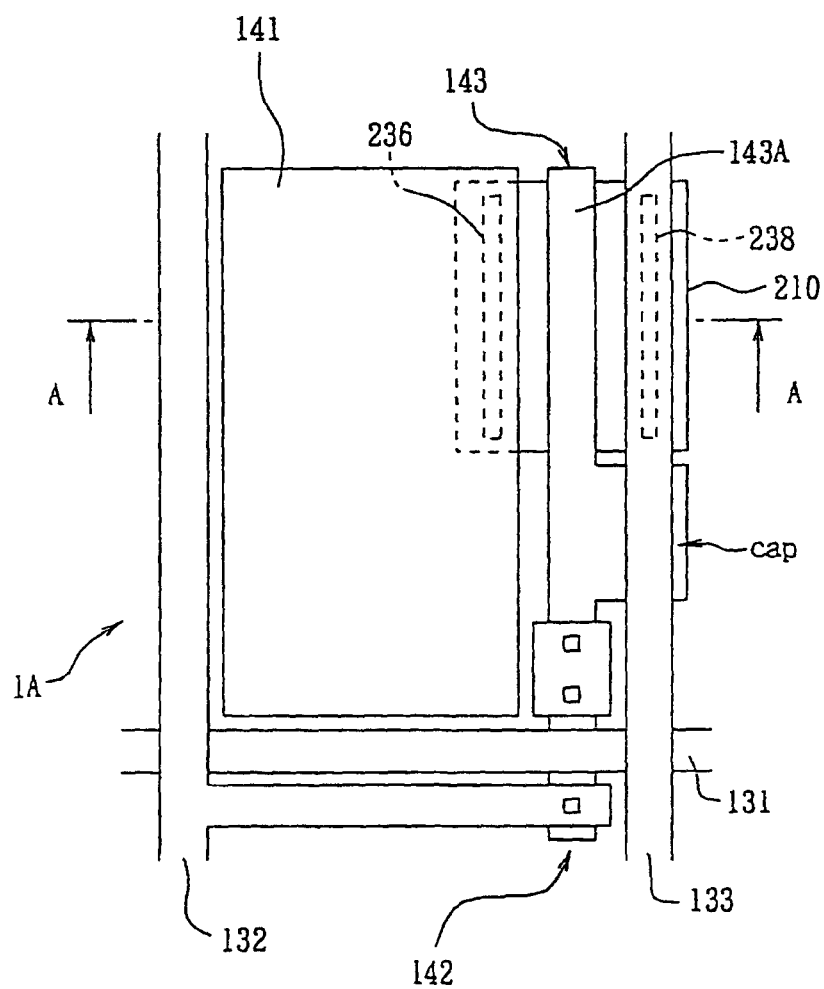

MATRIX TYPE DISPLAY DEVICE WITH OPTICAL MATERIAL AT PREDETERMINED POSITIONS AND MANUFACTURING METHOD THEREOF

This application is a divisional of U.S. patent application Ser. No. 09/077,029, filed on May 18, 1998, which in turn is a National Stage Application of International Application No. PCT/JP97/03297 filed Sep. 18, 1997, which claims priority to Japanese Patent Application No. 8-248087, filed in the Japanese Patent Office on Sep. 19, 1996. The disclosures of the prior applications are hereby incorporated by reference in their entirety.

TECHNICAL FIELD

The present invention relates to a matrix type display device and a manufacturing method thereof, and particularly to a matrix type display device having a structure in which an optical material such as a fluorescent material (luminescent material), a light modulation material or the like is selectively arranged at predetermined positions on a display substrate, the optical material being liquid at least during coating, and a manufacturing method thereof wherein the optical material can accurately be arranged at the predetermined positions.

BACKGROUND ART

Matrix type display devices such as an LCD (Liquid Crystal Display), an EL (Electroluminescence) display device, and the like are frequently used as various display devices that are light weight, thin, and have high image quality and high definition. A matrix type display device comprises matrix-formed bus lines, an optical material (luminescent material or light modulation material), and if required, other components.

In a monochromatic matrix type display device, wiring and electrodes must be arranged in a matrix on the display substrate, but the optical material can be uniformly coated over the entire surface of the display substrate.

In contrast, for example, when a so-called matrix type color display device is realized by using an EL display device of the type that emits light by itself, it is necessary to arrange three pixel electrodes corresponding to the primary colors RGB of light for each pixel, and coat the optical material corresponding to any one of the primary colors RGB for each pixel electrode. Namely, the optical material must be selectively arranged at the predetermined positions.

There is thus demand for developing a method of patterning the optical material. Suitable examples of effective patterning methods include etching and coating.

First, a layer of an optical material is formed over the entire surface of the display substrate. Then a resist layer is formed on the optical material layer, exposed to light through a mask and then patterned. Then the optical material layer is patterned by etching in correspondence with the resist pattern.

However, in this case, a large number of steps are required, and each of the materials and apparatus used is expensive, thereby increasing the cost. Also a large number of steps are required, and each of the steps is complicated, thereby deteriorating throughput. Further, depending upon chemical properties, some optical materials have low resistance to resist and an etchant, and thus these steps are impossible.

On the other hand, the coating process is carried out as follows.

First, an optical material is dissolved in a solvent to form a solution, and the thus-formed solution of the optical material is selectively coated at the predetermined positions on the display substrate by an ink jet method or the like. Then, if required, the optical material is solidified by heating, irradiation of light, or the like. In this case, a small number of steps are required, and each of the materials and apparatus used is inexpensive, thereby decreasing the cost. Also, a small number of steps are required, and each of the steps is simple, thereby improving throughput. Further, these steps are possible regardless of the chemical properties of the optical material used as long as a solution of the optical material can be formed.

The coating patterning method is thought to be easily carried out. However, as a result of experiment, the inventors found that in coating the optical material by the ink jet method, the optical material must be diluted at least several tens of times with a solvent, and thus the solution obtained has high fluidity, thereby causing difficulties in holding the solution at the coating positions until it is completely solidified after coating.

In other words, patterning precision deteriorates due to the fluidity of the solution of the optical material. For example, the optical material coated in a pixel flows to the adjacent pixels to deteriorate the optical properties of the pixels. Also variations occur in the coating areas in the respective pixels, thereby causing variations in the coating thickness and thus the optical properties of the optical material.

Although this problem significantly occurs with an optical material for EL display devices or the like, which is liquid during coating and then solidified, the problem also occurs in cases in which a liquid crystal that is liquid both during and after coating is selectively coated on the display substrate.

The present invention has been achieved in consideration of the unsolved problem of the prior art, and an object of the invention is to provide a matrix type display device in which a liquid optical material can securely be arranged at predetermined positions while maintaining characteristics such as low cost, high throughput, a high degree of freedom of the optical material, etc., and a manufacturing method thereof.

DISCLOSURE OF EMBODIMENTS

In order to achieve the object, an exemplary embodiment relates to a matrix type display device having a structure in which an optical Material is selectively arranged at predetermined positions on a display substrate, the optical material being liquid at least during coating-at the predetermined positions, wherein a difference in height is formed in the boundary between each of the predetermined positions and the periphery thereof, for selectively coating the optical material.

The exemplary embodiment permits selective arrangement of the optical material at the predetermined positions using the difference of height even if the optical material is liquid during coating. Namely, the matrix type display device is a high-quality matrix type display device comprising the optical material accurately arranged-at the predetermined positions.

In order to achieve the object, another exemplary embodiment relates to a method of manufacturing a matrix type display device having a structure in which an optical material is selectively arranged at predetermined positions on a display substrate, the optical material being liquid at least during coating at the predetermined positions, the method comprising the steps of forming a difference in height for coating the liquid optical material in the boundary between each of the predetermined positions and the periphery thereof on the display substrate, and coating the liquid optical material at the predetermined positions by using the difference of height.

The exemplary embodiment discussed above comprises forming the difference in height before coating the liquid optical material, and is thus capable of preventing the liquid optical material coated at the predetermined positions from spreading to the peripheries thereof by using the difference in height. As a result, it is possible to improve the pattering precision while maintaining characteristics such as low cost, high throughput, the high degree of freedom of the optical material, etc.

Another exemplary embodiment relates to the method of manufacturing a matrix type display device, wherein the difference in height is formed in a concave shape in which each of the predetermined positions is lower than the periphery thereof so that the liquid optical material is coated at the predetermined positions with the surface of the display substrate coated with the liquid optical material turned upward.

In the exemplary embodiment discussed above, the surface of the display substrate which is coated with the optical material is turned upward to turn the concave portions formed by the difference in height upward. When the liquid optical material is coated on the insides of the concave portions, the optical material stays in the concave portions due to gravity, and the coated liquid optical material can stay in the concave portions due to gravity, surface tension and the like as long as the amount of the optical material coated is not too large. Therefore, in this state, the optical material can be solidified by, for example, drying to perform patterning with high precision and with no problem.

Another exemplary embodiment relates to the method of manufacturing a matrix type display device, wherein the difference in height has a convex shape in which each of the predetermined positions is higher than the periphery thereof so that the liquid optical material is coated at the predetermined positions with the surface of the display substrate that is coated with the optical material turned downward.

In the exemplary embodiment discussed above, when the surface of the display substrate coated with the optical material is turned downward, the convex portions formed by the difference in height are also turned downward. In coating the liquid optical material on the convex portions, the optical material concentrates on the convex portions due to surface tension, and the coated liquid optical material can stay on the convex portions due to surface tension as long as the amount of the optical material coated is not too large. Therefore, in this state, the optical material can be solidified by, for example, drying to perform patterning with high precision and with no problem.

In order to achieve the object, another exemplary embodiment relates to a method of manufacturing a matrix type display device comprising an optical material selectively disposed at predetermined positions on a display device, the optical material being liquid at least during coating at the predetermined positions, the method comprising the steps of forming a plurality of first bus lines on the display substrate; coating the liquid optical material; forming a difference in height in the boundary between each of the predetermined positions on the display substrate and the periphery thereof, for coating the liquid optical material; coating the liquid optical material at the predetermined positions by using the difference in height: and forming a plurality of second bus lines crossing the first bus lines to cover the optical material.

In a method of manufacturing a so-called passive matrix type display device, the exemplary embodiments discussed above exhibit the same operation and effect.

In order to achieve the object, another exemplary embodiment relates to a method of manufacturing a matrix type display device comprising an optical material selectively disposed at predetermined positions on a display device, the optical material being liquid at least during coating at the predetermined positions, the method comprising the steps of forming a plurality of first bus lines on the display substrate; forming a difference in height in the boundary between each of the predetermined positions on the display substrate and the periphery thereof, for coating the liquid optical material; coating the liquid optical material at the predetermined positions by using the difference in height; forming a plurality of second bus lines on a peeling substrate through a peeling layer; and transferring the structure peeled off from the peeling layer on the peeling substrate onto the display substrate coated with the optical material so that the first bus lines cross the second bus lines.

In a method of manufacturing a so-called passive matrix type display device, the exemplary embodiment discussed above comprises no step of forming a layer for the second bus lines on the upper surface of the optical material disposed, and then etching the layer, thereby decreasing damage to the base material such as the optical material or the like in the subsequent step.

In order to achieve the object, another exemplary embodiment relates to a method of manufacturing a matrix type display device comprising an optical material selectively disposed at predetermined positions on a display device, the optical material being liquid at least during coating at the predetermined positions, the method comprising the steps of forming, on the display substrate, wiring including a plurality of scanning lines and signal lines, a pixel electrode corresponding to each of the predetermined positions, and switching elements for controlling the states of the pixel electrodes in accordance with the state of the wiring; forming a difference in height in the boundary between each of the predetermined positions on the display substrate and the periphery thereof, for coating the liquid optical material; and coating the liquid optical material at the predetermined positions by using the difference in height.

In a method of manufacturing a so-called active matrix type display device, the exemplary embodiments discussed above exhibit the same operation and effect.

In order to achieve the object, another exemplary embodiment relates to a method of manufacturing a matrix type display device comprising an optical material selectively disposed at predetermined positions on a display device, the optical material being liquid at least during coating at the predetermined positions, the method comprising the steps of forming a difference in height in the boundary between each of the-predetermined positions on the display substrate and the periphery thereof, for coating the liquid optical material; coating the liquid optical material at the predetermined positions by using the difference in height; forming wiring including a plurality of scanning lines and signal lines, a pixel electrode corresponding to each of the predetermined positions, and switching elements for controlling the states of the pixel electrodes in accordance with the state of the wiring on a peeling substrate through a peeling layer; and transferring the structure peeled off from the peeling layer on the peeling substrate onto, the display substrate coated with the optical material.

In a method of manufacturing a so-called active-matrix type display device, the exemplary embodiment discussed above comprises no step of forming a layer for the wiring and a layer for the pixel electrodes on the upper surface of the optical material disposed, and then etching the layers, thereby decreasing damage to the base material such as the optical material or the like in-the subsequent step, and damage to the scanning lines, the signal lines, the pixel electrodes or the switching elements due to coating of the optical material.

In another exemplary embodiment, the difference in height is formed by using the first bus lines and has a concave shape in which each of the predetermined positions is lower than the periphery thereof so that in the step of coating the liquid optical material, the liquid optical material is coated at the predetermined positions with the surface of the display substrate coated with the liquid crystal material turned upward.

In a method of manufacturing a so-called passive matrix type display device, the exemplary embodiment discussed above comprises the step of forming a difference in height by using the first bus lines. As a result, the step of forming the first bus lines, in whole or in part, can also be used as the step of forming the difference in height, thereby suppressing an increase in the number of the steps.

In another exemplary embodiment, the difference in height is formed by using the wiring and has a concave shape in which each of the predetermined positions is lower than the periphery thereof so that in the step of coating the liquid optical material, the liquid optical material is coated at the predetermined positions with the surface of the display substrate coated with the liquid crystal material turned upward.

In a method of manufacturing a so-called active matrix type display device, the exemplary embodiment discussed above comprises the step of forming a difference in height by using the wiring. As a result, part of the whole of the step of forming the wiring can also be used as the step of forming the difference in height, thereby suppressing an increase in the number of the steps.

In another exemplary embodiment, the difference in height is formed by using the pixel electrodes, and has a convex shape in which each of the predetermined positions is higher than the periphery thereof so that in the step of coating the liquid optical material, the liquid optical material is coated at the predetermined positions with the surface of the display substrate coated with the liquid crystal material turned downward.

In a method of manufacturing a so-called active matrix type display device, the exemplary embodiment discussed above comprises the step of forming a difference in height by using the pixel electrodes. As a result, the step of forming the wiring, in whole or in part, can also be used as the step of forming the difference in height, thereby suppressing an increase in the number of the steps.

Another exemplary embodiment relates to the method of manufacturing a matrix type display device, the method comprising the step of forming an interlevel insulation film, wherein the difference in height is formed by using the interlevel insulation film, and has a concave shape in which each of the predetermined positions is lower than the periphery thereof so that in the step of coating the liquid optical material, the liquid optical material is coated at the predetermined positions with the surface of the display substrate coated with the liquid crystal material turned upward.

In a method of manufacturing a so-called passive matrix type display device and a method of manufacturing a so-called active matrix type display device, the exemplary embodiment discussed above comprises the step or forming a difference in height by using the interlevel insulation film. As a result, the step of forming the interlevel insulation film, in whole or in part, can also be used as the step of forming the difference in height, thereby suppressing an increase in the number of the steps.

In another exemplary embodiment, the method comprising the step of forming a light shielding layer, wherein the difference in height is formed by using the light shielding layer, and has a concave shape in which each of the predetermined positions is lower than the periphery thereof so that in the step of coating the liquid optical material, the liquid optical material is coated at the predetermined positions with the surface of the display substrate coated with the liquid crystal material turned upward.

In a method of manufacturing a so-called passive matrix type display device and a method of manufacturing a so-called active matrix type display device, the exemplary embodiment discussed above comprises the step of forming a difference in height by using a light shielding layer. As a result, the step of forming the light shielding layer, in whole or in part, can also be used as the step of forming the difference in height, thereby suppressing an increase in the number of the steps. Another exemplary embodiment discloses that in the step of forming the difference in height, the difference in height is formed by selectively removing-the coated liquid material. Resist or the like can be used as the liquid material. In the us-e of resist, the resist is coated over the entire surface of the display device by spin coating to form a resist film having an appropriate thickness, followed by exposure and etching of the resist film to form a convex portion corresponding to each of the predetermined positions, whereby the difference in height can be formed.

The exemplary embodiment discussed above can simplify the step of forming the difference in height and can easily form a large difference in height while decreasing damage to the base material.

Another exemplary embodiment discloses that the difference in height is formed on the peeling substrate through the peeling layer in the step of forming the difference in height, and the structure peeled off from the peeling layer on the peeling substrate is transferred onto the display substrate.

The exemplary embodiment discussed above comprises the step of transferring the difference in height separately formed on the peeling substrate. Therefore, the exemplary embodiment can simplify the step of forming the difference in height and can easily form a large difference in height while decreasing damage to the base material.

Another exemplary embodiment discloses that the height dr of the difference in height satisfies the following equation (1):

$$da < dr \quad (1)$$

wherein d8 is the thickness of a single coat of the liquid optical material.

The exemplary embodiment discussed above is capable of preventing the optical material from flowing out to the peripheries of the predetermined positions beyond the concave difference in height without contribution of surface tension of the liquid optical material. Another exemplary embodiment discloses that the following equation (2) is satisfied:

$$Vd/(db-r) > Et \quad (2)$$

wherein −Vd is the driving voltage applied to the optical material, db is the total thickness of the respective coatings of the liquid optical material, r is the concentration of the liquid optical material, and Et is the minimum electric field strength (threshold electric field strength) at which a change in optical properties of the optical material occurs.

The exemplary embodiment discussed above defines the relation between the coating thickness and the driving voltage, thereby ensuring that the optical material exhibits an electro-optical effect.

Another exemplary embodiment discloses that the height dr of the difference in height satisfies the following equation (3):

$$df = dr \quad (3)$$

wherein df is the thickness of the optical material at the time of completion.

The exemplary embodiment discussed above ensures flatness of the difference in height and the optical material at the time of completion, and uniformity in the optical properties of the optical material, and can prevent a short circuit.

Another exemplary embodiment discloses that the thickness at the time of completion satisfies the following equation (4)

$$Vd/df > Et \qquad (4)$$

wherein Vd is the driving voltage applied to the optical material, and Et is the minimum electric field strength (threshold electric field strength) at which a change in optical properties of the optical material occurs.

The exemplary embodiment discussed above defines the relation between the coating thickness and the driving voltage, thereby ensuring that the optical material exhibits an electro-optical effect.

In order to achieve the object, another exemplary embodiment relates to a method of manufacturing a matrix type display device comprising an optical material selectively disposed at predetermined positions on a display device, the optical material being liquid at least during coating at the predetermined positions, the method comprising the steps of enhancing the affinity to liquid at the predetermined positions on the display device relative to the affinity to liquid of the peripheries thereof, and coating the liquid optical material at the predetermined positions.

In the exemplary embodiment discussed above, since the affinity to liquid at the predetermined positions is enhanced before the liquid optical material is coated, the liquid optical material coated at the predetermined positions more easily stays at the predetermined positions than the peripheries thereof, and the difference in affinity to liquid between each of the predetermined positions and the periphery thereof is sufficiently increased to prevent the liquid optical material coated at the predetermined positions from spreading to the peripheries thereof. As a result, it is possible to improve the precision of patterning while maintaining the properties such as low cost, high throughput and the high degree of freedom of the optical material.

The step of enhancing the affinity to liquid at the predetermined positions on the display substrate relative to the affinity to liquid of the peripheries thereof possibly comprises enhancing the affinity to liquid at the predetermined positions, enhancing the liquid repellency of the peripheries of the predetermined positions, or performing both methods.

In order to achieve the object, another exemplary embodiment relates to a method of manufacturing a matrix type display device comprising an optical material selectively disposed at predetermined positions on a display device, the optical material being liquid at least during coating at the predetermined positions, the method comprising the steps of forming a plurality of first bus lines on the display device, enhancing the affinity to liquid at the predetermined positions on the display device relative to the affinity to liquid of the peripheries thereof, coating the liquid optical material at the predetermined positions, and forming a plurality of second bus lines crossing the first bus lines to cover the optical material.

In a method of manufacturing a so-called passive matrix type display device, the exemplary embodiments discussed above exhibit the same operation and effect.

In order to achieve the object, another exemplary embodiment relates to a method of manufacturing a matrix type display device comprising an optical material selectively disposed at predetermined positions on a display device, the optical material being liquid at least during coating at the predetermined positions, the method comprising the steps of forming a plurality of first bus lines on the display device, enhancing the affinity to liquid at the predetermined positions on the display device relative to the affinity to liquid of the peripheries thereof, coating the liquid optical material at the predetermined positions, forming a plurality of second bus lines on a peeling substrate through a peeling layer, and transferring the structure peeled off from the peeling layer on the peeling substrate onto the display substrate coated with the optical material so that the first bus lines cross the second bus lines.

In a method of manufacturing a so-called passive matrix type display device, the exemplary embodiment discussed above comprises no step of forming a layer for the second bus lines on the disposed optical material and etching the layer. It is thus possible to decrease damage to the base material such as the optical material or the like in the subsequent step.

In order to achieve the object, another exemplary embodiment relates to a method of manufacturing a matrix type display device comprising an optical material selectively disposed at predetermined positions on a display device, the optical material being liquid at least during coating at the predetermined positions, the method comprising the steps of forming, on the display device, wiring including a plurality of scanning lines and signal lines, a pixel electrode corresponding to each of the predetermined positions, and switching elements for controlling the states of the pixel electrodes in accordance with the state of the wiring; enhancing the affinity to liquid at the predetermined positions on the display device relative to the affinity to liquid of the peripheries thereof, and coating the liquid optical material at the predetermined positions.

In a method of manufacturing a so-called active matrix type display device, the exemplary embodiments discussed above exhibit the same operation and effect.

In order to achieve the object, another exemplary embodiment relates to a method of manufacturing a matrix type display device comprising an optical material selectively disposed at predetermined positions on a display device, the optical material being liquid at least during coating at the predetermined positions, the method comprising the steps of enhancing the affinity to liquid at the predetermined positions on the display device relative to the affinity to liquid of the peripheries thereof: coating the liquid optical material at the predetermined positions: forming wiring including a plurality of scanning lines and signal lines, a pixel electrode corresponding to the each of the predetermined positions, and switching elements for controlling the states of the pixel electrodes in accordance with the state of the wiring on a peeling substrate through a peeling layer; and transferring the structure peeled off from the peeling layer on the peeling substrate onto the display substrate coated with the optical material.

In a method of manufacturing a so-called active matrix type display device, the exemplary embodiment discussed above comprises no step of forming a layer for wiring and a layer for the pixel electrodes on the optical material disposed and etching these layers. It is thus possible to decrease damage to the base material such as the optical material or the like in the subsequent step, and damage to the scanning lines, the signal lines, the pixel electrodes or the switching elements due to coating of the optical material.

Another exemplary embodiment relates to the method of manufacturing a matrix type display device, wherein a distribution of high liquid repellency is formed along the first bus lines on the display substrate to enhance the affinity to liquid at the predetermined positions on the display substrate relative to the affinity to liquid of the peripheries thereof.

In a method of manufacturing a so-called passive matrix type display device, the exemplary embodiment discussed above comprises forming a distribution of high liquid repellency along the first bus lines. As a result, the step of forming the first bus lines, in whole or in part, can also be used as the step of enhancing the affinity to liquid at the predetermined positions relative to the affinity to liquid of the peripheries thereof, thereby suppressing an increase in the number of the steps.

Another exemplary embodiment discloses that a distribution of high liquid repellency is formed along the wiring on the display substrate to enhance the affinity to liquid at the predetermined positions on the display substrate relative to the affinity to liquid of the peripheries thereof.

In a method of manufacturing a so-called active matrix type display device, the exemplary embodiment discussed above comprises forming a distribution of high liquid repellency along the wiring. As a result, the step of forming the first bus lines, in whole or in part, can also be used as the step of enhancing the affinity to liquid at the predetermined positions relative to the affinity to liquid of the peripheries thereof, thereby suppressing an increase in the number of the steps.

Another exemplary embodiment discloses that the affinity to liquid of the surfaces of the pixel electrodes on the display substrate are enhanced to enhance the affinity to liquid at, the predetermined positions on the display substrate relative to the affinity to liquid of the peripheries thereof.

In a method of manufacturing a so-called active matrix type display device, the exemplary embodiment discussed above comprises enhancing the affinity to liquid of the surfaces of the pixel electrodes. As a result, the step of forming the pixel electrodes, in whole or in part, can also be used as the step of enhancing the affinity to liquid at the predetermined positions relative to the affinity to liquid of the peripheries thereof, thereby suppressing an increase in the number of the steps.

Another exemplary embodiment relates to the method of manufacturing a matrix type display device, the method comprising the step of forming an interlevel insulation film, wherein a distribution of high liquid repellency is formed along the interlevel insulation film on the-display substrate to enhance the affinity to liquid at the predetermined positions on the display substrate relative to the affinity to liquid of the peripheries thereof.

In a method of manufacturing a so-called s passive matrix type display device, the exemplary embodiment discussed above comprises forming a distribution of high liquid repellency along the interlevel insulation film. As a result, the step of forming the interlevel insulation film, in whole or impart, can also be used as the step of enhancing the affinity to liquid at the predetermined positions relative to the affinity to liquid of the peripheries thereof, thereby suppressing an increase in the number of the steps.

Another exemplary embodiment relates to the method of manufacturing a matrix type display device, the method comprising the step of forming an interlevel insulation film so that the surfaces of the pixel electrodes are exposed, wherein in forming the interlevel insulation film, a difference in height for coating the liquid optical material is formed in the boundary between the portion where the surface of each of the pixel electrodes is exposed and the periphery thereof, and the liquid repellency of the surface of the interlevel insulation film is enhanced to enhance the affinity to liquid at the predetermined positions on the display substrate relative to the affinity to liquid of the peripheries thereof.

In the exemplary embodiment discussed above, the difference in height is formed in such a concave shape as another exemplary embodiment by using the interlevel insulation film before the liquid optical material is coated, and the liquid repellency of the surface of the interlevel insulation film is enhanced to enhance the affinity to liquid at the predetermined positions relative to the affinity to liquid of the peripheries thereof. Therefore, the exemplary embodiments discussed above exhibit the same effects, thereby securely preventing the liquid optical material coated at the predetermined positions from spreading to the peripheries thereof. As a result, it is possible to further improve the patterning precision while maintaining the properties such as low cost, high throughput and the high degree of freedom of the optical material.

Another exemplary embodiment includes the step of forming a light shielding layer, wherein a distribution of high liquid repellency is formed along the light shielding layer on the display substrate to enhance the affinity to liquid at the predetermined positions on the display substrate relative to the affinity to liquid of the peripheries thereof.

In a method of manufacturing a so-called passive matrix type display device and a method of manufacturing a so-called active matrix type O display device, the exemplary embodiment discussed above comprises forming a distribution of high liquid repellency along the light shielding layer. As a result, the step of forming the light shielding layer, in whole or in part, can also be used as the step of enhancing the affinity to liquid at the predetermined positions relative to the affinity to liquid of the peripheries thereof, thereby suppressing an increase in the number of the steps.

Another exemplary embodiment discloses that a difference in affinity to liquid between each of the predetermined positions and the periphery thereof is increased by irradiating ultraviolet rays or plasma of .OZ, CF3, Ar or the like.

The exemplary embodiment discussed above is capable of easily enhancing the liquid repellency of the surface of the interlevel insulation film, for example. Another exemplary embodiment includes the step of enhancing the affinity to liquid at the predetermined positions on the display substrate relative to the affinity to liquid of the peripheries thereof.

Another exemplary embodiment includes the step of forming a difference in height in the boundary between each of the predetermined positions on the display substrate and the periphery thereof, for coating the liquid optical material.

The exemplary embodiment discussed above comprises forming a predetermined difference in height and enhancing the affinity to liquid at the predetermined positions relative to the affinity to liquid of the peripheries thereof before the liquid optical material is coated. Therefore, the exemplary embodiments discussed above exhibit the same effects, thereby securely preventing the liquid optical material coated at the predetermined positions from spreading to the peripheries thereof. As a result, it is possible to further improve the patterning precision while maintaining the properties such as low cost, high throughput and the high degree of freedom of the optical material.

In order to achieve the object, another exemplary embodiment relates to a method of manufacturing a matrix type display device comprising an optical material selectively disposed at predetermined positions on a display device, the optical material being liquid at least during coating at the predetermined positions, the method comprising the steps of forming a potential distribution on the display substrate so that the potential at each of the predetermined positions is different from that of the periphery thereof, and selectively coating the liquid optical material at the predetermined positions by using the potential distribution.

The exemplary embodiment discussed above comprises forming a potential distribution before the liquid optical material is coated so that the liquid optical material coated at the predetermined positions can be prevented from spreading to the peripheries thereof by the potential distribution. As a result, it is possible to improve the patterning precision while maintaining the properties such as low cost, high throughput and the high degree of freedom of the optical material.

In order to achieve the object, another exemplary embodiment relates to a method of manufacturing a matrix type display device comprising an optical material selectively disposed at predetermined positions on a display device, the optical material being liquid at least during coating at the predetermined positions, the method comprising the steps of forming a potential distribution on the display substrate so that the potential at each of the predetermined positions is different from that of the periphery thereof, and coating the liquid optical material at the predetermined positions after charging the optical material to a potential where repulsive force is generated between each of the predetermined positions and the periphery thereof.

The exemplary embodiment discussed above comprises generating repulsive force between the liquid optical material that is coated at the predetermined positions and the peripheries thereof so as to prevent the liquid optical material coated at the predetermined positions from spreading to the peripheries thereof. As a result, it is possible to improve the patterning precision while maintaining the properties such as low cost, high throughput and the high degree of freedom of the optical material. In order to achieve the object, another exemplary embodiment relates to a method of manufacturing a matrix type display device comprising an optical material selectively disposed at predetermined positions on a display device, the optical material being liquid at least during coating at the predetermined positions, the method comprising the steps of forming a plurality of first bus lines on the display substrate, forming a potential distribution on the display substrate so that the potential at each of the predetermined positions is different from that of the periphery thereof, coating the liquid optical material at the predetermined positions after charging the optical material to a potential where repulsive force is generated between each of the predetermined positions and the periphery thereof, and forming a plurality of second bus lines crossing the first bus lines to cover the optical material.

In a method of manufacturing a so-called passive matrix type display device, the exemplary embodiments discussed above exhibit the same operation and effect.

In order to achieve the object, another exemplary embodiment relates to a method of manufacturing a matrix type display device comprising an optical material selectively disposed at predetermined positions on a display device, the optical material being liquid at least during coating at the predetermined positions, the method comprising the steps of forming a plurality of first bus lines on the display substrate, forming a potential distribution on the display substrate so that the potential at each of the predetermined positions is different from that of the periphery thereof, coating the liquid optical material at the predetermined positions after charging the optical material to a potential at which repulsive force is generated between each of the predetermined positions and the periphery thereof, forming a plurality of second bus lines on a peeling substrate through a peeling layer, and transferring the structure peeled off from the peeling layer on the peeling substrate onto the display substrate coated with the optical material so that the first bus lines cross the second bus lines.

In a method of manufacturing a so-called passive matrix type display device, the exemplary embodiment discussed above comprises no step of forming a layer for the second bus lines on the upper surface of the disposed optical material and etching the layer, thereby decreasing damage to the base material such as the optical material or the-like in the subsequent step.

In order to achieve the object, another exemplary embodiment relates to a method of manufacturing a matrix type display device comprising an optical material selectively disposed at predetermined positions on a display device, the optical material being liquid at least during coating at the predetermined positions, the method comprising the steps of forming on the display substrate wiring including a plurality of scanning lines and signal lines, a pixel electrode corresponding to each of the predetermined positions and switching elements for controlling the states of the pixel electrodes in accordance with the state of the wiring, forming a potential distribution on the display substrate so that the potential at each of the predetermined positions is different from that of the periphery thereof, and coating the liquid optical material at the predetermined positions after charging the optical material to a potential at which repulsive force is generated between each of the predetermined positions and the periphery thereof.

In a method of manufacturing a so-called active matrix type display device, the exemplary embodiments discussed above exhibit the same operation and effect.

In order to achieve the object, another exemplary embodiment relates to a method of manufacturing a matrix type display device comprising an optical material selectively disposed at predetermined positions on a display device, the optical material being liquid at least during coating at the predetermined positions, the method comprising the steps of forming a potential distribution on the display substrate so that the potential at each of the predetermined positions is different from that of the periphery thereof, coating the liquid optical material at the predetermined positions after charging the optical material to a potential at which repulsive force is generated between each of the predetermined positions and the periphery thereof, forming wiring including a plurality of scanning lines and signal lines, a pixel electrode corresponding to each of the predetermined positions and switching elements for controlling the states of the pixel electrodes in accordance with the state of the wiring on a peeling substrate through a peeling layer, and transferring the structure peeled off from the from the peeling layer on the peeling substrate onto the display substrate coated with the optical material.

In a method of manufacturing a so-called active matrix type display device, the exemplary embodiment discussed above comprises no step of forming a layer for the wiring and a layer for the pixel electrodes on the upper surface of the disposed optical material and etching these layers, thereby decreasing damage to the base material such as the optical material or the like in the subsequent step, and damage to the scanning lines, the signal lines, the pixel electrodes or the switching elements due to coating of the optical material.

Another exemplary embodiment discloses that the potential distribution is formed so that at least the peripheries of the predetermined positions on the-display substrate are charged.

The exemplary embodiment discussed above is capable of securely generating a repulsive force by charging the liquid optical material.

Another exemplary embodiment discloses that the potential distribution is formed by applying a voltage to the first bus lines.

Another exemplary embodiment relates to the method of manufacturing a matrix 10 type display device, wherein the potential distribution is formed by applying a voltage to the wiring.

Another exemplary embodiment relates to the method of manufacturing a matrix type display device, wherein the potential distribution 'l is formed by applying a voltage to the pixel electrodes. Another exemplary embodiment relates to the method of manufacturing a matrix type display device, wherein the potential distribution-is formed by successively applying a voltage to the scanning lines, and at the same time, applying a voltage to the signal lines, and applying a voltage to the pixel electrodes through the switching elements.

Another exemplary embodiment relates to the method of manufacturing a matrix type display device, comprising the step of forming a light shielding layer so that the potential distribution is formed by applying a voltage to the light shielding layer.

The exemplary embodiment discussed above comprises forming the potential distribution by using a component of the matrix type display device, and is thus capable of preventing an increase in the number of the steps.

Another exemplary embodiment relates to the method of manufacturing a matrix type display device, wherein the potential distribution is formed so that each of the predetermined positions has a polarity opposite to that of the periphery thereof.

In the exemplary embodiment discussed above, attractive force is generated between the liquid optical material and each of the predetermined positions, and repulsive force is generated between the liquid optical material and the peripheries of the predetermined positions, thereby making the optical material easy to stay at the predetermined positions, and improving the patterning precision.

In the method of manufacturing a matrix type display device, for example, an inorganic or organic fluorescent material (luminescent material) can be used as the optical material. As the fluorescent material (luminescent material), an EL (Electroluminescent) material is suitable. In order to obtain the liquid optical material, the optical material may be dissolved in an appropriate solvent.

In the method of manufacturing a matrix type display device, a liquid crystal can also be used as the optical material.

Another exemplary embodiment relates to the method of manufacturing a matrix type display device, wherein the switching elements are formed by using amorphous silicon, polycrystalline silicon formed by a high temperature process at 600° C. or higher, or polycrystalline silicon formed by a low temperature process at 600° C. or lower.

The exemplary embodiment discussed above can also improve the precision of patterning of the optical material. Particularly, in the use of polycrystalline silicon formed by a low temperature process, it is possible to decrease the cost by using a glass substrate, and improve performance due to high mobility.

BRIEF DESCRIPTION OF THE DRAWINGS

FIG. 2 is an enlarged plan view showing the plane structure of a pixel region.

BEST MODE FOR CARRYING OUT THE INVENTION

Preferred embodiments of the present invention will be described below on the basis of the drawings.

(1) First Embodiment

FIGS. 1 to 5(d) are drawings illustrating a first embodiment of the present invention. In this embodiment, a matrix type display device and a manufacturing method thereof of the present invention are applied to an active matrix type EL display device. Specifically, these drawings show an embodiment in which a luminescent material as an optical material is coated, and scanning lines, signal lines and common current supply lines serve as wiring.

Figure 1:
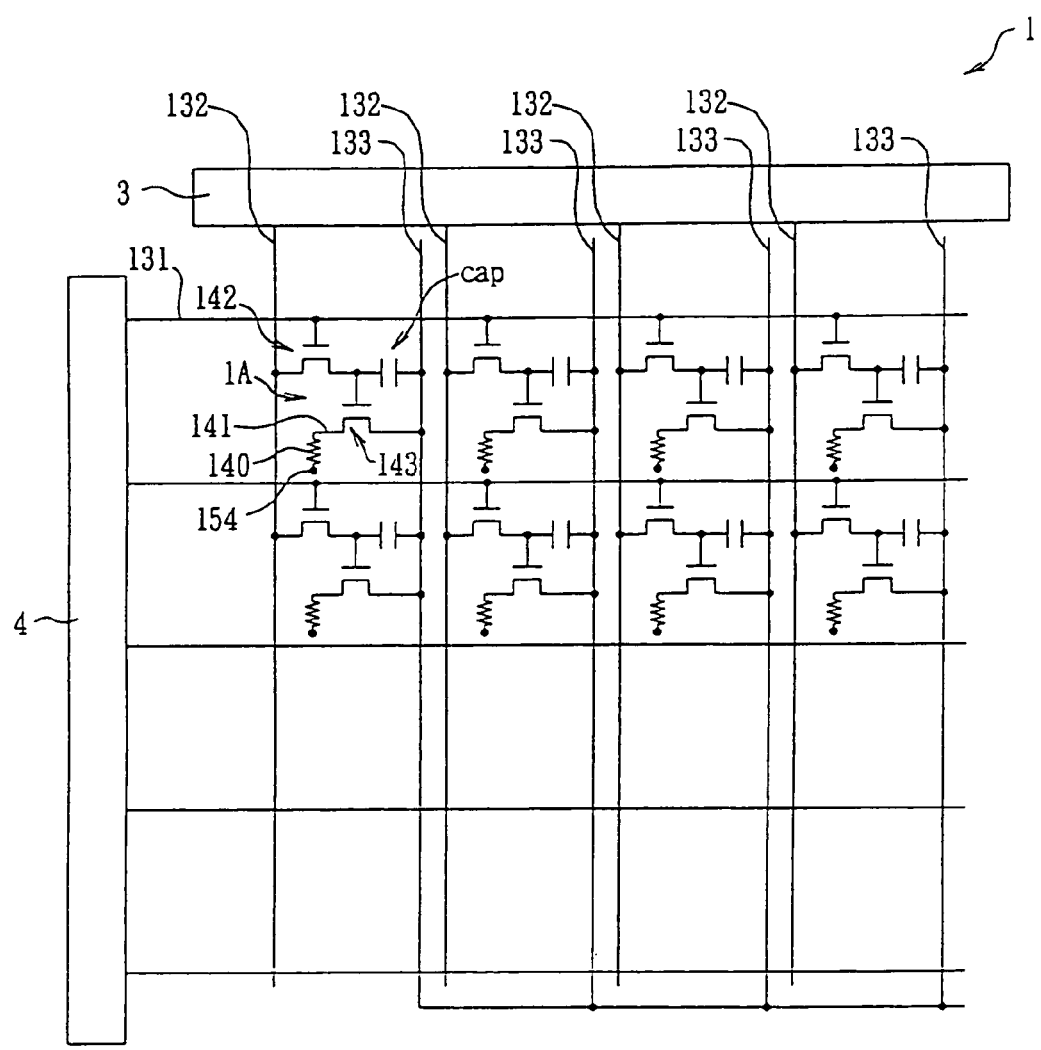
FIG. 1 is a diagram of a circuit showing a portion of a display device in accordance with a first embodiment of the present invention.

FIG. 1 is a drawing of a circuit showing a portion of a display device 1 in this embodiment. The display device 1 comprises wiring including a plurality of scanning lines 131, a plurality of signal lines 132 extending in the direction crossing the scanning lines 131, and a plurality of common current supply lines 133 extending parallel to the signal lines 132; and a pixel region 1A provided for each of the intersections of the scanning lines 131 and the signal lines 132.

For the signal lines 132, a data side driving circuit 3 comprising a shift register, a level shifter, a video line, and an analog switch is provided. For the scanning lines 131, a scanning side driving circuit 4 comprising a shift register and a level shifter is provided. Provided in each pixel region 1A are: a switching thin film transistor 142 in which a scanning signal is supplied to a gate electrode through a scanning line 131, a storage capacitor cap for holding an image signal supplied from a signal line 132 through the switching thin film transistor 142, a current thin film transistor 143 in which the image signal held by the storage capacitor cap is supplied to a gate electrode, a pixel electrode 141 to which a driving current flows from a common current supply line 133 at the time of electrical connection to the common current supply line 133 through the current thin film transistor 143, and a light emitting element 140 held between the pixel electrode 141 and a reflection electrode 154.

In this configuration, when the switching thin film transistor 142 is turned on by driving the scanning lines 131, the potential of the signal lines 132 is held by the storage capacitor cap, and the on-off state of the current thin film transistor 143 is determined in accordance with the state of the storage capacitor cap. Then a current flows to the pixel electrode 141 from the common current supply lines 133 through the channel of the current thin film transistor 143, and a current flows to the reflection electrode 154 through the light emitting element 140, whereby the light emitting element 140 emits light in accordance with the amount of the current flowing therethrough.

Each of the pixel regions 1A has a planar structure in which the pixel electrode 141 having a rectangular planar shape is arranged so that the four sides thereof are surrounded by a signal line 132, a common current supply line 133, a scanning line 131 and a scanning line for another pixel electrode, as shown in FIG. 2 which is an enlarged plan view-with the reflection electrode and the light emitting element removed.

FIGS. 3(a)-3(e), 4(a)-4(c) and 5(a)-5(d) are sectional views successively showing the steps for manufacturing the pixel region 1A, and correspond to a section taken along line-A-A in FIG. 2. The process for manufacturing the pixel region 1A is described with reference to FIGS. 3(a)-3(e), 4(a)-4(c) and 5(a)-5(d).

Figure 3A:
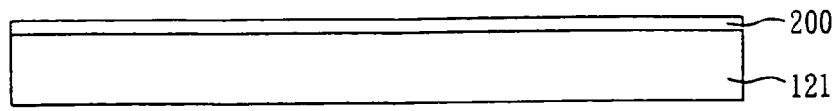
FIGS. 3(a)-3(e), 4(a)-4(c) and 5(a)-5(d) are sectional views showing the flow of a manufacturing process in accordance with the first embodiment.

First, as shown in FIG. 3(a), on a transparent display substrate 121 is formed a base protective film (not shown) comprising a silicon oxide film having a thickness of about 2000 to 5000 angstroms by a plasma CVD method using TEOS (tetraethoxysilane) and oxygen gas as raw material gases according to demand. Next, the temperature of the display substrate 121 is set to about 350° C., and on the surface of the base protective film is formed a semiconductor film 200 comprising an amorphous silicon film having a thickness of about 300 to 700 angstroms by the plasma CVD method. The semiconductor film 200 comprising an amorphous silicon film is then subjected to the crystallization step by laser annealing or solid phase growth to crystallize the semiconductor film 200 to a polysilicon film. In laser annealing, for example, an excimer laser line beam having a long dimension of 400 mm and an output strength of, for example, 200 mJ/cm2 is used. The line beam is scanned so that a portion thereof corresponding to 90% of the laser strength peak in the direction of the short dimension is applied to each of the regions.

Figure 3B:
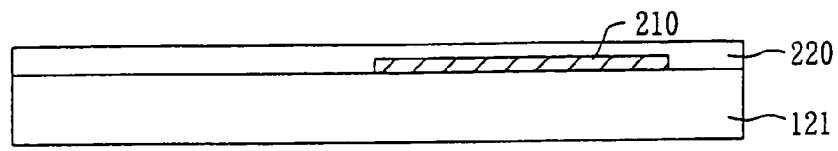

Next, as shown in FIG. 3(b), the semiconductor film 200 is patterned to form an island-like semiconductor film 210, and on the surface of the semiconductor film 210 is formed a gate insulating film 220, comprising a silicon oxide film or nitride film having a thickness of about 600 to 1500 angstroms, by the plasma CVD method using TEOS (tetraethoxysilane) and oxygen gas as raw material gases. Although the semiconductor film 210 is used for the channel region and source/drain regions of the current thin film transistor 143, another semiconductor film is also formed for forming the channel region and source/drain regions of the switching thin film transistor 142 in another sectional view. Namely, in the manufacturing process shown in FIGS. 3(a)-3(e), 4(a)-4(c) and 5(a)-5(d), two types of transistors 142 and 143 are simultaneously formed, but both transistors are formed according to the same procedure. Therefore, with respect to the transistors, only the current thin film transistor 143 is described below, and description of the switching thin film transistor 142 is omitted.

Figure 3C:
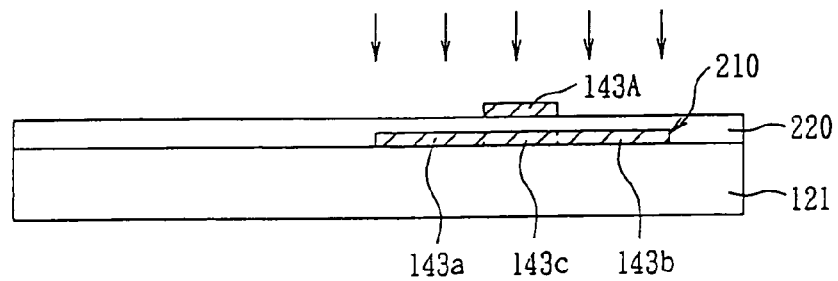

Next, as shown in FIG. 3(c), a conductive film comprising a metallic film of aluminum, tantalum, molybdenum, titanium, tungsten, or the like is formed by a sputtering method, and then patterned to form a gate electrode 143A.

In this state, a high concentration of phosphorus ions is implanted to form source and drain regions 143a and 143b in the silicon thin film 210 in self-alignment to the gate electrode 143. A portion into which the impurity is not introduced serves as a channel region 143c.

Figure 3D:
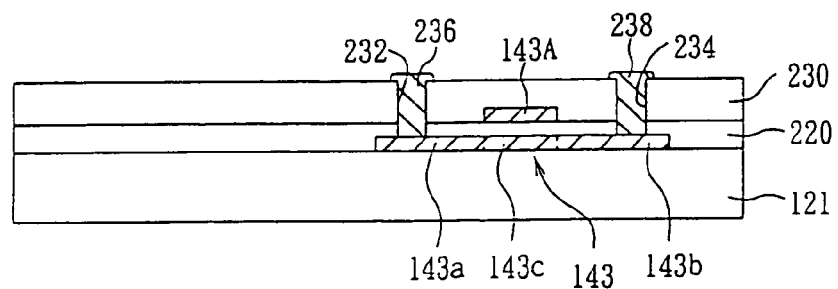

Next, as shown in FIG. 3(d), an interlevel insulation film 230 is formed, contact holes 232 and 234 are formed, and then trunk electrodes 236 and 238 are buried in the contact holes 232 and 234, respectively.

Figure 3E:
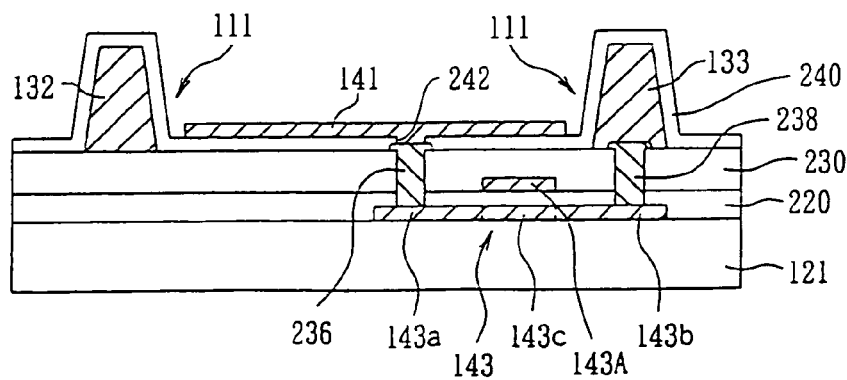

Next, as shown in FIG. 3(e), on the interlevel insulation film 230 are formed a signal line 132, a common current supply line 133 and a scanning line (not shown in FIG. 3(e)). Each of the signal lines 132, the common current supply lines 133 and the scanning lines is formed sufficiently thick regardless of the required thickness as wiring. Specifically, each of the lines is formed to a thickness of about 1 to 2 um. The trunk electrode 238 and each of the lines may be formed in the same step. In this case, the trunk electrode 238 is formed of an ITO film which will be described below.

Then an interlevel insulation film 240 is formed to cover the upper surfaces of the lines, a contact hole 242 is formed at a position corresponding to the trunk electrode 236, and an ITO film is formed to fill the contact hole 242 therewith, followed by patterning of the ITO film to form a pixel electrode 141 electrically connected to the source and drain region 143a at the predetermined position surrounded by the signal line 132, the common current supply line 133 and the scanning line.

In FIG. 3(e), the portion between the signal line 132 and the common current supply line 133 corresponds to the predetermined position where the optical material is arranged. A difference in height 111 is formed between the predetermined position and the periphery thereof by the signal line 132 and the common current supply line 133. Specifically, the difference in height 111 is formed in a concave shape in which the predetermined position is lower than the periphery thereof.

Figure 4A:
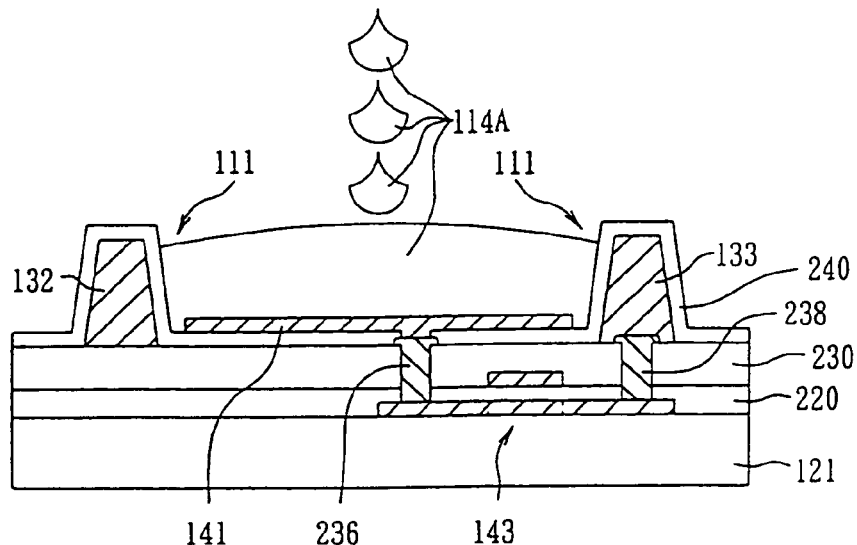

Next, as shown in FIG. 4(a), a liquid (a solution in a solvent) optical material (precursor) 114A for forming a hole injection layer corresponding to a lower layer of the light emitting element 140 is discharged by an ink jet head method with the upper side of the display substrate 121 turned upward to selectively coat the optical material on the region (the predetermined position) surrounded by the difference in height 111. Since detailed contents of the ink jet method are not included in the gist of the present invention, the contents are omitted (For such a method, refer to Japanese Unexamined Patent Publication Nos. 56-13184 and 2167751, for example).

Materials for forming the hole injection layer include polyphenylenevinylene obtained from polytetrahydrothiophenylphenylene as a polymer precursor, 1,1-bis-(4-N,N-ditolylaminophenyl)cyclohexane, tris(8hydroxyquinolynol) aluminum, and the like.

At this time, although the liquid precursor 114A has high fluidity and tends to horizontally spread, the difference in height 111 is formed to surround the coating position, thereby preventing the liquid precursor 114A from spreading to the outside of the predetermined position beyond the difference in height 111 as long as the amount of the liquid precursor 114A coated in a single application is not excessively increased.

Figure 4B:
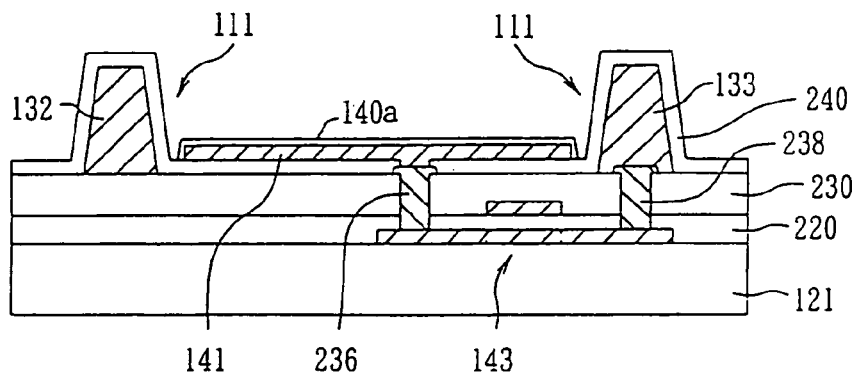
Figure 4C:
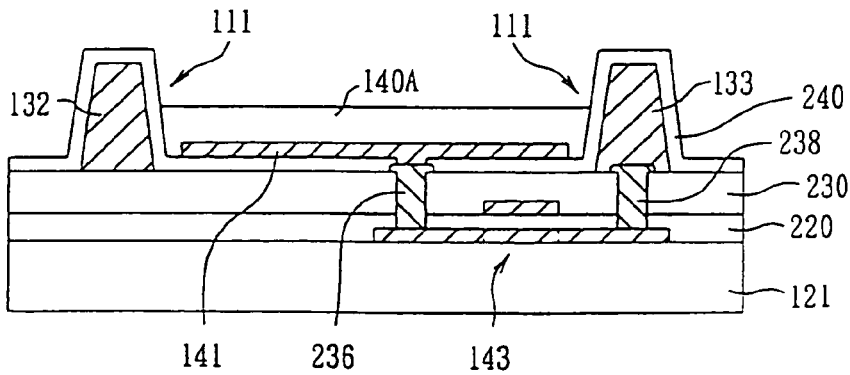

Next, as shown in FIG. 4(b), the solvent of the liquid precursor 114A is evaporated by heating or light irradiation to form a thin, solid hole injection layer 140a on the pixel electrode 141. Depending upon the concentration of the liquid precursor 114A, only a thin hole injection layer 140a is formed. Therefore, where a thicker hole injection layer 140a is required, the steps shown in FIGS. 4(a) and (b) are repeatedly executed a necessary number of times to form the hole injection layer 140A having a sufficient thickness, as shown in FIG. 4(c).

Figure 5A:
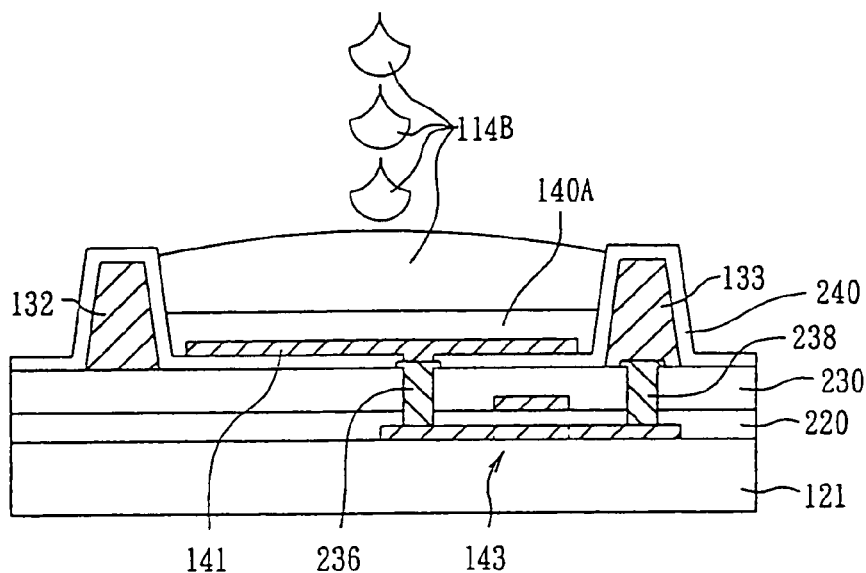

Next, as shown in FIG. 5(a), a liquid (a solution in a solvent) of an optical material (organic fluorescent material) 114B for forming an organic semiconductor film corresponding to an upper layer of the light emitting element 140 is discharged by the ink jet head method with the upper surface of the display substrate 121 turned upward to selectively coat the optical material on the region (the predetermined position) surrounded by the difference in height 111.

Organic fluorescent materials include cyanopolyphenylenevinylene, polyphenylenevinylene, polyalkylphenylene, 2,3,6,7-tetrahydro-11-oxo1H,5H,11H(1) benzopyrano[6,7,8-ij]-quinolizine-10-carboxylic acid, 1,1-bis-(4-N,N-ditolylaminophenyl)cyclohexane, 2-13',4'-dihydroxyphenyl)-3,5,7-trihydroxy-1-benzopyrylium perchlorate, tris(8-hydroxyquinolynol)aluminum, 2,3,6,7-tetrahydro-9-methyl-11-oxo-1H,5H,11H(1) benzopyrano[6,7,8-ij]-quinolizine, aromatic diamine derivatives (TDP), oxydiazole dimers (OXD), oxydiazole derivatives (MD), distyrylarylene derivatives (DSA), quinolynol metal complexes, beryllium-benzoquinolynol derivatives (Bebq), triphenylamine derivatives (MTDATA), distyryl derivatives, pyrazoline dimers, rubrene, quinacridone, triazole derivatives, polyphenylene, polyalkylfluorene, polyalkylthiophene, azomethine zinc complexes, porphyrin zinc complexes, benzoxazole zinc complexes, phenanthroineeuropiem complexes, and the like.

At this time, although the liquid organic fluorescent material 114B has high fluidity and tends to horizontally spread, the difference in height 111 is formed to surround the coating position, thereby preventing the liquid organic fluorescent material 114B from spreading to the outside of the predetermined position beyond the difference in height 111 as long as the amount of the liquid organic fluorescent material 114B coated in a single application is not excessively increased.

Figure 5B:
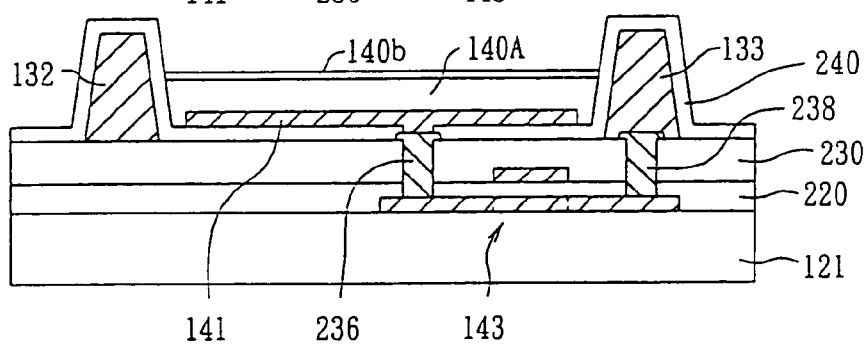
Figure 5C:
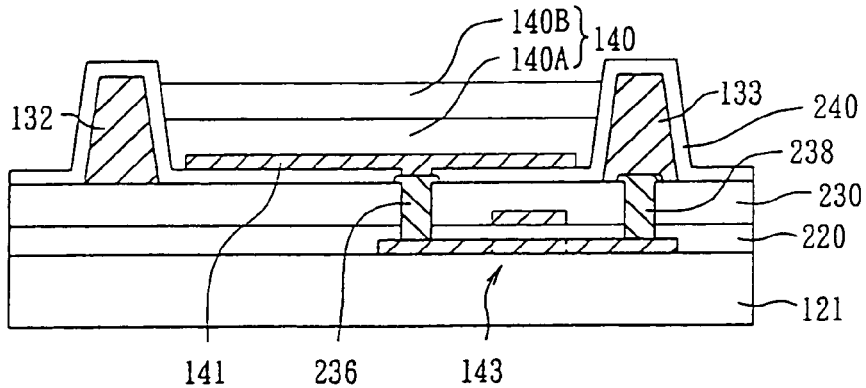

Next, as shown in FIG. 5(b), the solvent of the liquid organic fluorescent material 114B is evaporated by heating or light irradiation to form a solid organic semiconductor thin film 140b on the hole injection layer 140A. Depending upon the concentration of the liquid organic fluorescent material 114B, only a thin organic semiconductor film 140b is formed. Therefore, where a thicker organic semiconductor layer 140b is required, the steps shown in FIGS. 5(a) and (b) are repeatedly executed a necessary number of times to form the organic semiconductor film 140B having a sufficient thickness, as shown in FIG. 5(c).

Figure 5D:
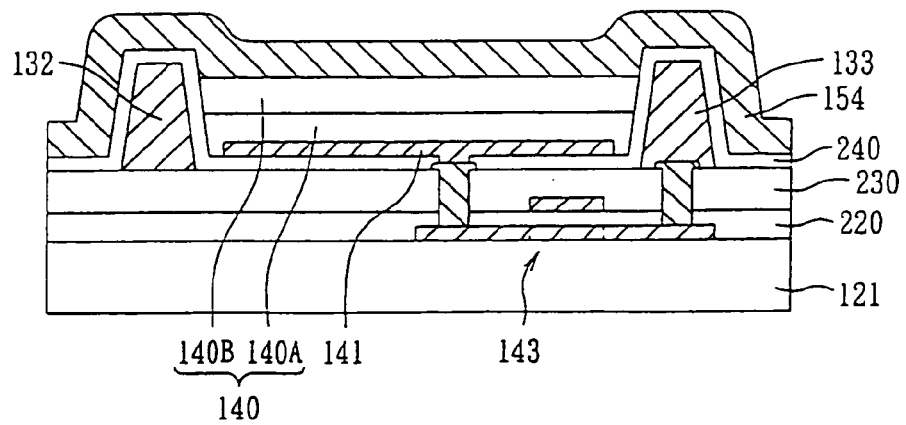

The hole injection layer 140A and the organic semiconductor film 140B constitute the light emitting element 140. Finally, as shown in FIG. 5(d), the reflection electrode 154 is formed over the entire surface of the display substrate 121 or in stripes.

In this embodiment, lines such as the signal line 132, the common current supply line 133, and the like are formed to surround the processing position where the light emitting element 140 is arranged, and are formed to have a thickness larger than the normal thickness to form the difference in height 111, and the liquid precursor 114A and the liquid organic fluorescent material 114B are selectively coated. Therefore, this embodiment has the advantage that the patterning precision of the light emitting element 140 is high.

Although the formation of the difference in height 111 causes the reflection electrode 154 to have a surface with relatively large unevenness, the possibility of producing a trouble such as disconnection or the like is significantly decreased by increasing the thickness of the reflection electrode 154 to some extent.

In addition, since the difference in height 111 is formed by using the lines such as the signal line 132, the common current supply line 133, and the like, a new step is not added, and the manufacturing process is not significantly complicated.

In order to securely prevent the liquid precursor 114A and the liquid organic fluorescent material 114B from flowing out from the inside of the difference in height 111, the following relation is preferably established between the coating thickness da of the liquid precursor 114A and the liquid organic fluorescent material 114B and the height dr of the difference in height 111.

$$da < dr \quad (1)$$

However, when the liquid organic fluorescent material 114E is coated, the hole injection layer 140A has already been formed, and thus the height dr of the difference in height 111 must be considered as a value obtained by subtracting the thickness of the hole injection layer 140A from the initial thickness.

Also, equation (1) is satisfied, and the following relation is established between the driving voltage Vd applied to the organic semiconductor film 140B, the total thickness db of the liquid organic fluorescent material 114B, the concentration r of the liquid organic fluorescent material 114B, and the minimum electric field strength Et (threshold electric field strength) at which a change in optical properties of the organic semiconductor film 140B occurs.

$$Vd/(db-r) > Et \quad (2)$$

In this case, the relation between the coating thickness and the driving voltage is defined, and it is ensured that the organic semiconductor film 140E exhibits an electro-optical effect.

On the other hand, in order to ensure the flatness of the difference in height 111 and the light emitting element 140 and uniformity in changes in the optical properties of the organic semiconductor film 140B, and prevent short circuit, the following relation may be established between the thickness df of the light emitting element 140 at the time of completion and the height dr of the difference in height 111:

$$df = dr \quad (3)$$

In addition, if equation (3) is satisfied, and the following equation (4) is satisfied, the relation between the thickness of the light emitting element 140 at the time of completion and the driving voltage is defined, and it is ensured that the organic fluorescent material exhibits an electro-optical effect.

$$Vd/df > Et \quad (4)$$

However, in this case, the thickness df is the thickness of the organic semiconductor film 140B at the time of completion, not the thickness of the entire light emitting element 140.

The optical material which forms the upper layer of the light emitting layer 140 is not limited to the organic fluorescent material 114B, and an inorganic fluorescent material may be used.

Each of the transistors 142 and 143 as switching elements is preferably made of polycrystalline silicon formed by a low temperature process at 600° C. or less, thereby achieving low cost by using a glass substrate, and high performance due to high mobility. The switching elements may be made of amorphous silicon or polycrystalline silicon formed by a high temperature process at 600° C. or higher.

Besides the switching thin film transistor 142 and the current thin film transistor 143, another transistor may be provided, or a system of driving by only one transistor may be used.

The difference in height 111 may be formed by using the first bus lines in a passive matrix display device, the scanning lines 131 in an active matrix display device, or the light shielding layer.

In the light emitting element 140, the hole injection layer 140A may be omitted, though the efficiency of light emission (rate of hole injection) slightly deteriorates. Alternatively, an electron injection layer is formed between the organic semiconductor film 140E and the reflection electrode 154 in place of the hole injection layer 140A, or both the hole injection layer and the electron injection layer may be formed.

Figure 6:
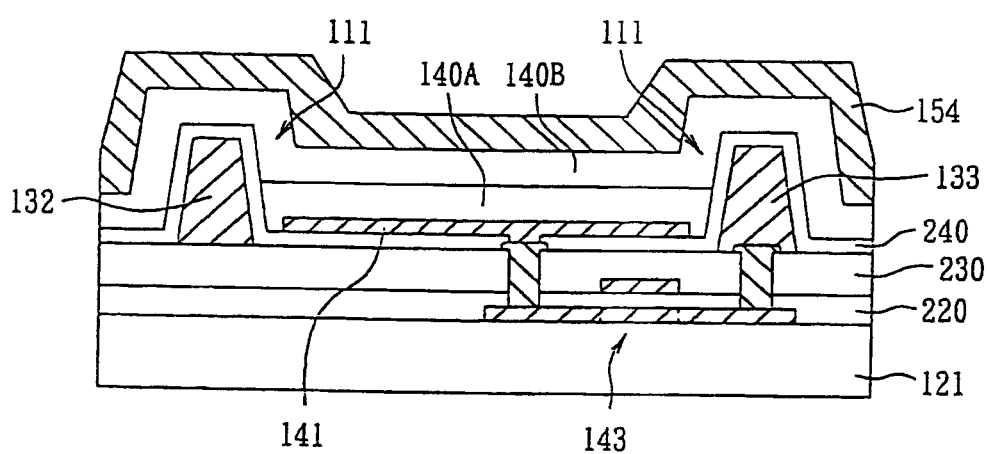
FIG. 6 is a sectional view showing a modified embodiment of the first embodiment.

Although, in this embodiment, the entire light emitting element 140 is selectively arranged in consideration of color display, for example, in a monochrome display device 1, the organic semiconductor film 140B may be uniformly formed over the entire surface of the display substrate 121, as shown in FIG. 6. However, even in this case, the hole injection layer 140A must be selectively arranged at each of the predetermined positions in order to prevent crosstalk, and thus it is significantly effective to coat the optical material by using the difference in height 111.

(2) Second Embodiment

Figure 7A:
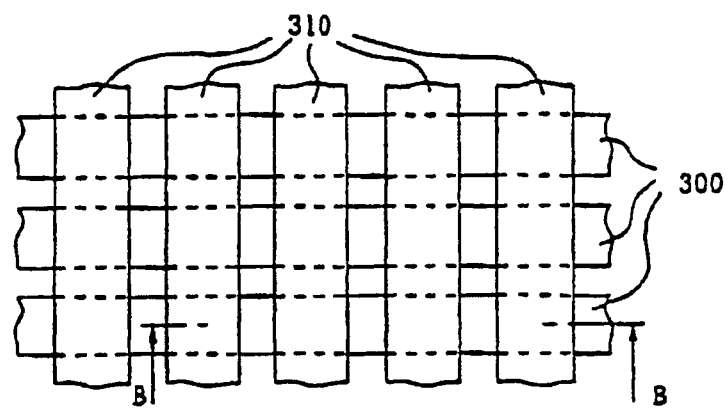
FIGS. 7(a) and 7(b) are a plan view and sectional view showing a second embodiment.
Figure 7B:
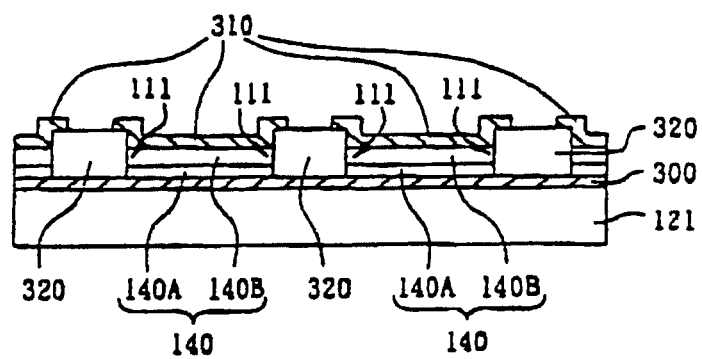

FIGS. 7(*a*) and 7(*b*) are drawings showing a second embodiment of the present invention in which a matrix type display device and a manufacturing method thereof in accordance with the present invention are applied to a passive matrix type display device using an EL display device.

FIG. 7(*a*) is a plan view showing the arrangement of a plurality of first bus lines 300 and a plurality of second bus lines 310 arranged perpendicularly to the first bus lines 300, and FIG. 7(*b*) is a sectional view taken along line B-B in FIG. 7(*a*). The same components as the first embodiment are denoted by the same reference numerals, and description thereof is omitted. Since details of the manufacturing process are also the same as the first embodiment, the process is not shown in the drawings nor described.

Namely, in this embodiment, an insulation film 320 of SiO2, for example, is arranged to surround the predetermined position where the light emitting element 140 is disposed, to form the difference in height 111 between the predetermined position and the periphery thereof.

Like the first embodiment, this structure is capable of preventing the liquid precursor 114A and the liquid organic fluorescent material 114E from flowing out to the periphery during selective coating, and has the advantage of achieving high-precision patterning.

(3) Third Embodiment

Figure 8:
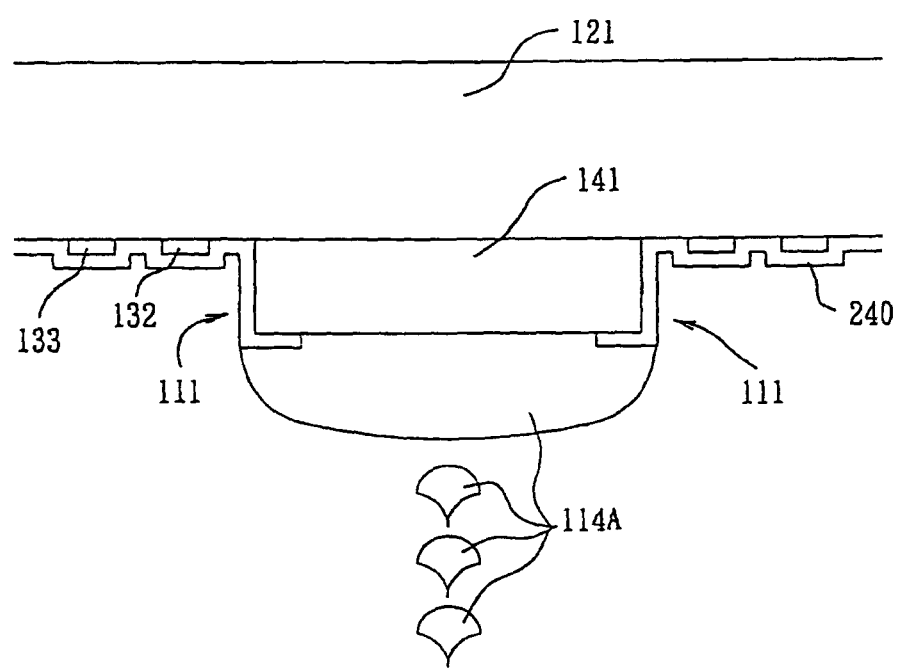
FIG. 8 is a sectional view showing a portion of a manufacturing process in accordance with a third embodiment.

FIG. 8 is a drawing showing a third embodiment of the present invention in which, like in the first embodiment, a matrix type display device and a manufacturing method thereof in accordance with the present invention are applied to an active matrix type EL display device. Specifically, the difference in height 111 is formed by using the pixel electrode 141, thereby permitting high-precision patterning. The same components as the above embodiments are denoted by the same reference numerals. FIG. 8 is a sectional view showing an intermediate step of the manufacturing process, and the steps before and after this step are not shown nor described because they are substantially the same as the first embodiment.

Namely, in this embodiment, the pixel electrode 141 is formed to have a thickness larger than-a normal thickness to form the difference in height 111 between the pixel electrode 141 and the periphery thereof. In other words, in this embodiment, the difference in height is formed in a convex shape in which the pixel electrode 141 later coated with the optical material is higher than the periphery thereof.

Like in the first embodiment, in order to form the hole injection layer corresponding to the lower layer of the light emitting element 140, the liquid (a solution in a solvent) optical material (precursor) 114A is discharged to coat the optical material on the upper surface of the pixel electrode 141.

However, unlike in the first embodiment, the liquid precursor 114A is coated on the display substrate while the display substrate is reversed, i.e., in the state where the upper surface of the pixel electrode 141 that is coated with the precursor 114A is turned downward.

As a result, the liquid precursor 114A stays on the upper surface of the pixel electrode due to gravity and surface tension, and does not spread to the periphery thereof. Therefore, the liquid precursor 114A can be solidified by heating or light irradiation to form the same thin hole injection layer as shown in FIG. 4(*b*), and this step is repeated to form the hole injection layer. The organic semiconductor film can also be formed by the same method.

In this way, in this embodiment, the liquid optical material is coated by using the difference in height 111 formed in a convex shape, thereby improving patterning precision of the light emitting element.

The amount of the liquid optical material staying on the upper surface of the pixel electrode 141 may be adjusted by using inertial force such as centrifugal force or the like.

(4) Fourth Embodiment

Figure 9:
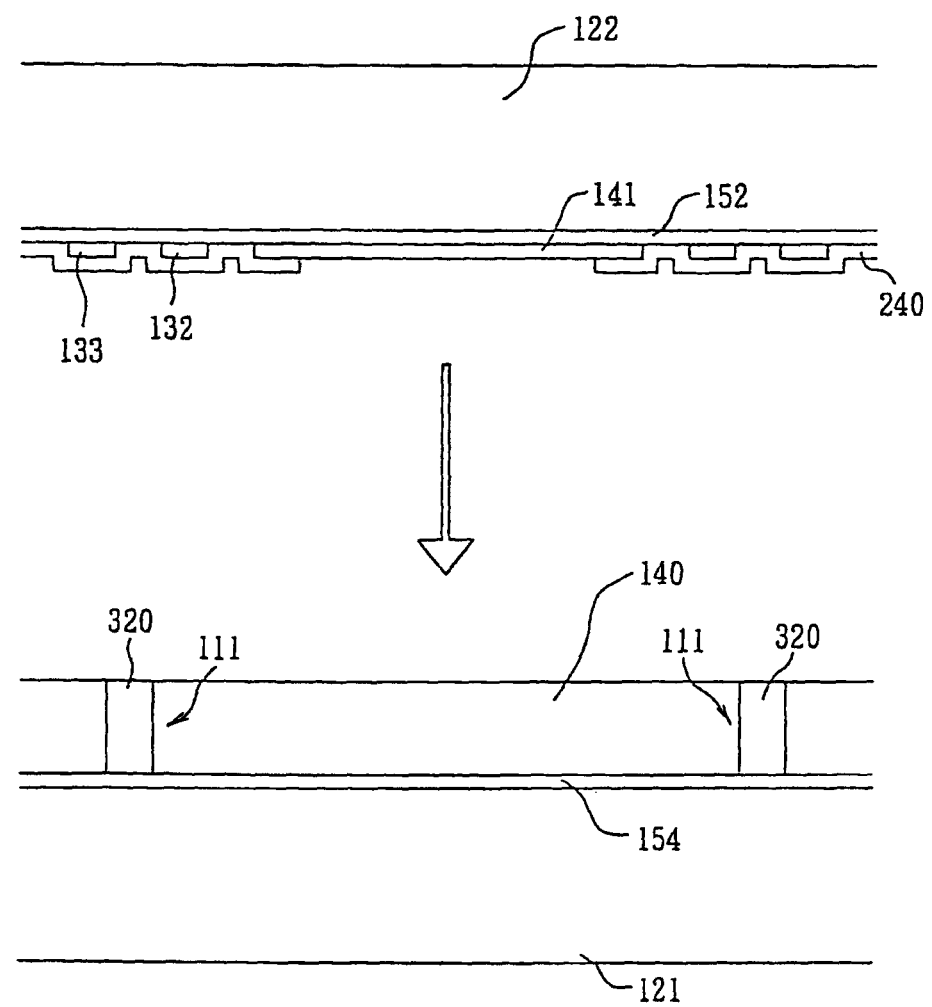
FIG. 9 is a sectional view showing a portion of a manufacturing process in accordance with a fourth embodiment.

FIG. 9 is a drawing showing a fourth embodiment of the present invention in which like in the first embodiment, a matrix type display device and a manufacturing method thereof in accordance with the present invention are applied to an active matrix type EL display device. The same components as the above embodiments are denoted by the same reference numerals. FIG. 9 is a sectional view showing an intermediate step of the manufacturing process, and the steps before and after this step are not shown nor described because they are substantially the same as the first embodiment.

Namely, in this embodiment, first the reflection electrode 154 is formed on the display substrate 121, and then the insulation film 320 is formed on the reflection electrode 154 to surround the predetermined position where the light emitting element 140 is arranged later, and to form the difference in height 111 in a concave shape in which the predetermined position is lower than the periphery thereof.

Like in the first embodiment, the liquid optical material is then selectively coated in the region surrounded by the difference in height 111 by the ink jet method to form the light emitting element 140.

On the other hand, scanning lines 131, signal lines 132, pixel electrodes 141, switching thin film transistors 142, current thin film transistors 143 and an insulation film 240 are formed on a peeling substrate 122 through a peeling layer 152.

Finally, the structure peeled off from the peeling layer 122 on the peeling substrate 122 is transferred onto the display substrate 121.

In this embodiment, the liquid optical material is coated by using the difference in height 111, thereby permitting patterning with high precision.

Further, in this embodiment, it is possible to decrease damage to the base material such as the light emitting element 140 in subsequent steps, or damage to the scanning lines 131, the signal lines 132, the pixel electrodes 141, the switching thin film transistors 142, the current thin film transistors 143 or the insulation film 240, due to coating of the optical material.

Although, in this embodiment, an active matrix type display device is described, a passive matrix type display device may be used.

(5) Fifth Embodiment

Figure 10:
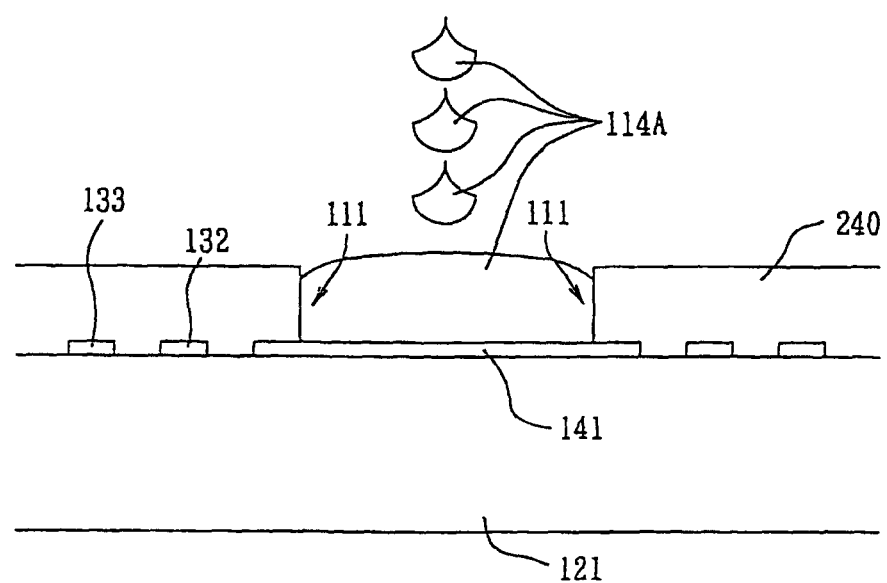
FIG. 10 is a sectional view showing a portion of a manufacturing process in accordance with a fifth embodiment.

FIG. 10 is a drawing showing a sixth embodiment of the present invention in which like in the first embodiment, a matrix type display device and a manufacturing method thereof in accordance with the present invention are applied to an active matrix type EL display device. FIG. 10 is a sectional view showing an intermediate step of the manufacturing process, and the steps before and after this step are not shown nor described because they are substantially the same as the first embodiment.

Namely, in this embodiment, the difference in height 111 is formed in a concave shape by using the interlevel insulation film 240 to obtain the same operation and effect as the first embodiment.

Also, since the difference in height 111 is formed by using the interlevel insulation film 240, a new step is not added, and thus the manufacturing process is not significantly complicated.

(6) Sixth Embodiment

Figure 11:
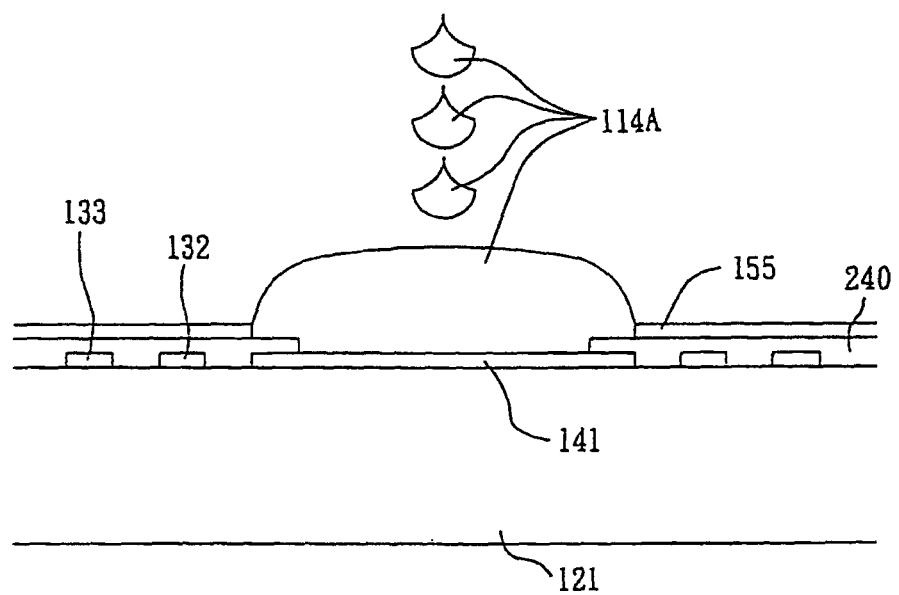
FIG. 11 is a sectional view showing a portion of a manufacturing process in accordance with a sixth embodiment.

FIG. 11 is a drawing showing a sixth embodiment of the present invention in which like in the first embodiment, a matrix type display device and a manufacturing method thereof in accordance with the present invention are applied to an active matrix type EL display device. The same components as the above embodiments are denoted by the same reference numerals. FIG. 11 is a sectional view showing an intermediate step of the manufacturing process, and the steps before and after this step are not shown and described because they are substantially the same as the first embodiment.

Namely, in this embodiment, the difference in height is not used for improving pattering precision, but the hydrophilicity of the predetermined position where the liquid optical material is coated is enhanced relative to the hydrophilicity of the periphery thereof to prevent the coated liquid optical material from spreading to the periphery.

Specifically, as shown in FIG. 11, the interlevel insulation film 240 is formed, and then an amorphous silicon layer 155 is formed on the upper surface of the interlevel insulation film 240. Since the amorphous silicon layer 155 has high water repellency relative to ITO which forms the pixel electrode 141, a distribution of water repellency and hydrophilicity is formed in which the hydrophilicity of the surface of the pixel electrode 141 is high relative to the hydrophilicity of the periphery thereof.

Like in the first embodiment, the liquid optical material is then selectively coated on the upper surface of the pixel electrode 141 by the ink jet method to form the light emitting element 140, and finally the reflection electrode is formed.

In this way, even in this embodiment, the liquid optical material is coated after a desired distribution of water repellency and hydrophilicity is formed, and thus the patterning precision can be improved.

Of course, this embodiment can also be applied to a passive matrix type display device.

Also this embodiment may comprise the step of transferring the structure formed on the peeling substrate through the peeling layer 152 onto the display substrate 121.

Although, in this embodiment, the desired distribution of water repellency and hydrophilicity is formed by using the amorphous silicon layer 155, the distribution of water repellency and hydrophilicity may be formed by using a metal, an anodic oxide film, an insulation film of polyimide, silicon oxide, or the like, or other materials. In a passive matrix display device, the distribution may be formed by using the first bus lines, and in an active matrix type display device, the distribution may be formed by using the scanning lines 131, the signal lines 132, the pixel electrodes 141, the insulation film 240 or the light shielding layer.

Although, in this embodiment, description is made on the assumption that the liquid optical material is an aqueous solution, a solution of an optical material in another liquid may be used.

In this case, liquid repellency and lyophilicity to this solution may be required.

(7) Seventh Embodiment

A seventh embodiment of the present invention has the same sectional structure as the fifth embodiment shown in FIG. 10, and is thus described with reference to FIG. 10.

Namely, in this embodiment, the interlevel insulation film 240 is formed by using SiO2, and the surface of the interlevel insulation film 240 is irradiated with ultraviolet rays. Then the surface of the pixel electrode 141 is exposed, and the liquid optical material is selectively coated thereon.

In this manufacturing process, not only the difference in height 111 is formed, but also a distribution of high liquid repellency is formed along the surface of the interlevel insulation film 240, thereby enabling the coated liquid optical material to easily stay at the predetermined position due to both effects, i.e., the difference in height 111 and the liquid repellency of the interlevel insulation film 240. Namely, since the effects of both the fifth embodiment and the sixth embodiment are exhibited, the patterning precision of the light emitting element 140 can further be improved.

The time of ultraviolet irradiation may be before or after the surface of the pixel electrode 141 is exposed, and may be appropriately selected in accordance with the material for forming the interlevel insulation film 240 and the material for forming the pixel electrode 141. Where ultraviolet irradiation is carried out before the surface of the pixel electrode 141 is exposed, since the inner wall of the difference in height 111 has low liquid repellency, the liquid optical material advantageously stays in the region surrounded by the difference in height 111. Conversely, where ultraviolet irradiation is carried out after the surface of the pixel electrode 141 is exposed, it is necessary to perform vertical irradiation of ultraviolet rays so as to prevent an increase in the liquid repellency of the inner wall of the difference in height 111. However, since ultraviolet irradiation is performed after the etching step for exposing the surface of the pixel electrode 141, there is the advantage of eliminating the possibility that the liquid repellency deteriorates in the etching step.

As the material for forming the interlevel insulation film 240, for example, photoresist or polyimide may be used. These materials have the advantage that the film can be formed by spin coating.

For some materials forming the interlevel insulation film 240, liquid repellency may be enhanced by irradiation of plasma of O2, CF3, Ar or the like, for example, in place of ultraviolet irradiation.

(8) Eighth Embodiment

Figure 12:
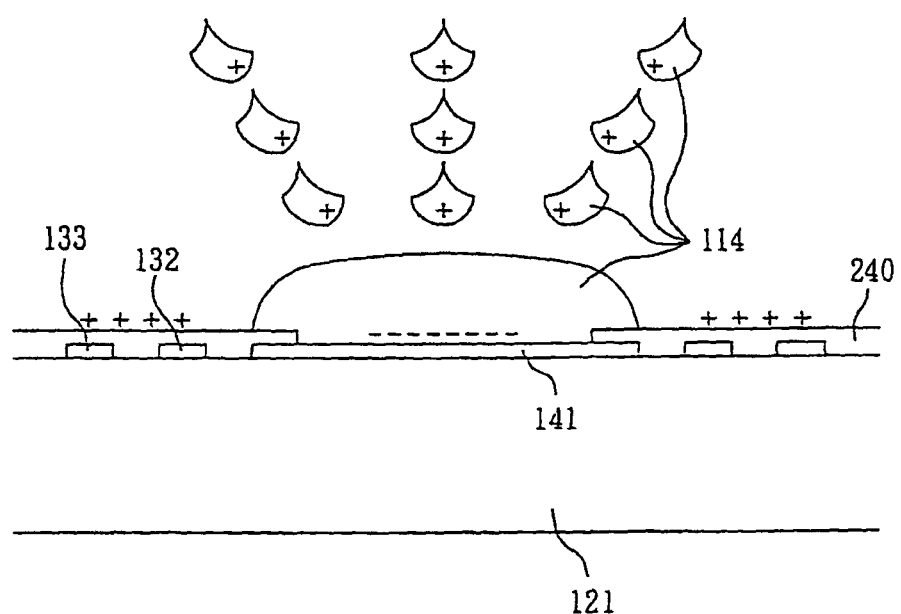
FIG. 12 is a sectional view showing a portion of a manufacturing process in accordance with an eighth embodiment.

FIG. 12 is a drawing showing an eighth embodiment of the present invention in which, like in the first embodiment, a matrix type display device and a manufacturing method thereof in accordance with the present invention are applied to an active matrix type EL display device. The same components as the above embodiments are denoted by the same reference numerals. FIG. 12 is a sectional view showing an intermediate step of the manufacturing process, and the steps before and after this step are not shown nor described because they are substantially the same as the first embodiment.

Namely, in this embodiment, neither the y difference in height nor the distribution of liquid repellency and affinity to liquid is used for improving the patterning precision, but the patterning precision is improved by using attraction force and repulsive force due to a potential.

As shown in FIG. 12, the signals lines 132 and the common current supply lines 133 are driven, and the transistors not shown are turned on and off to form a potential distribution in which the pixel electrode 141 has a negative potential, and the interlevel insulation film 240 has a positive potential. Then the positively charged liquid optical material 114 is selectively coated at the predetermined position by the ink jet method.

In this way, in this embodiment, a desired potential distribution is formed on the display substrate 121, and the liquid optical material is selectively coated by using attraction force and repulsive force between the potential distribution and the positively charged liquid optical material 114, thereby improving the patterning precision.

Particularly, in this embodiment, since the liquid optical material 114 is charged, the effect of improving the patterning precision is further increased by using not only spontaneous polarization but also electric charge.

Although in this embodiment the invention is applied to an active matrix type display device, the invention can also be applied to a passive matrix type display device.

This embodiment may further comprise the step of transferring the structure formed on the peeling substrate 121 through the peeling layer 152 onto the display substrate 121.

Also, in this embodiment, the desired potential distribution is formed by successively applying a potential to the scanning lines 131, and at the same time, applying a potential to the signal lines 132 and the common current supply lines 133, and applying a potential to the pixel electrodes 141 through the switching thin film transistor 142 and the current thin film transistor 143. Since the potential distribution is formed by using the scanning lines 131, the signal lines 132, the common current supply lines 133 and the pixel electrodes 141, an increase in the number of the steps can be suppressed. In a passive matrix type display device, the potential distribution may be formed by using the first bus lines or the light shielding layer.

Figure 13:
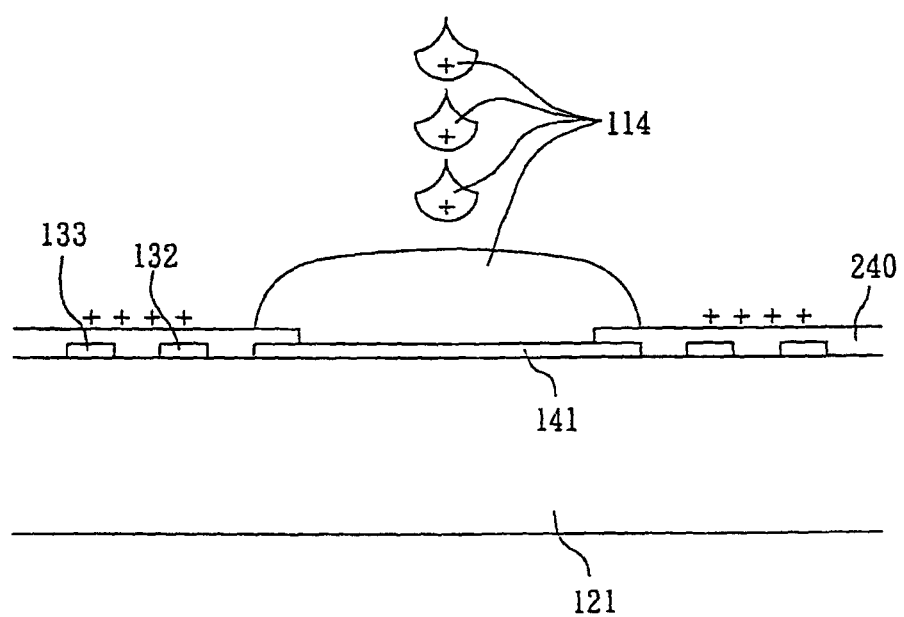
FIG. 13 is a sectional view showing a modified embodiment of the eighth embodiment.

Although, in this embodiment, a potential is applied both the pixel electrode 141 and the peripheral interlevel insulation film 240, the present invention is not limited to this. For example, as shown in FIG. 13, a positive potential may be applied only to the interlevel insulation film 240, with no potential applied to the pixel electrode 141, and then the liquid optical material 114 may be coated after being positively charged. In this case, since the liquid optical material 114 can securely be maintained in a positively charged state after coating, it is possible to securely prevent the liquid optical material 114 from flowing out to the periphery due to the repulsive force between the optical material and the peripheral interlevel insulation film 240.

Unlike in each of the above embodiments, for example, the difference in height 111 may be formed by coating a liquid material or forming a material on the peeling substrate through the peeling layer and then transferring the structure peeled off from the peeling layer on the peeling substrate onto the display substrate.

Although, in each of the above embodiments, an organic or inorganic EL material is used as the optical material, the optical material is not limited to these materials, and may be a liquid crystal.

INDUSTRIAL APPLICABILITY

As described above, in the present invention, since a liquid optical material is coated by using a difference in height, a desired distribution of liquid repellency and affinity to liquid, or a desired potential distribution, there is the effect of improving the patterning precision of the optical material.

The invention claimed is:
1. A method of manufacturing a light emitting element including a plurality of first electrodes, a second electrode and an organic semiconductor film disposed between the plurality of first electrodes and the second electrode, the method comprising:
  forming current supply lines, signal lines and scanning lines on a substrate;
  forming an interlayer insulating film on the substrate, the current supply lines, the signal lines and the scanning lines; and
  forming the plurality of first electrodes on the interlayer insulating film, such that a step is formed between the plurality of first electrodes and a periphery thereof, the plurality of first electrodes being completely surrounded by the step, and the step being formed of the current supply lines, the signal lines and the scanning lines;
  selectively coating a material, which is for forming a positive hole injection layer and which is dissolved in a solvent, in regions surrounded by the step by an inkjet method;
  removing the solvent including the material and selectively forming the positive hole injection layer in the regions surrounded by the step;
  selectively coating an organic semiconductor material dissolved in a solvent in the regions surrounded by the step by an inkjet method; and
  removing the solvent including the organic semiconductor material and forming the organic semiconductor film in the regions surrounded by the step.
2. The method of manufacturing a light emitting element according to claim 1, further comprising:
  selectively coating a material, which is for forming an electron injection layer and which is dissolved in a solvent, in the regions surrounded by the step by an inkjet method; and
  removing the solvent including the material for forming the electron injection layer and forming the electron injection layer in the regions surrounded by the step.

* * * * *